(12) United States Patent
Peters

(10) Patent No.: US 11,856,732 B2
(45) Date of Patent: Dec. 26, 2023

(54) PLUGGABLE INTRINSICALLY SAFE BARRIER

(71) Applicant: Volley Boast, LLC, Houston, TX (US)

(72) Inventor: Mark E. Peters, Hamilton, OH (US)

(73) Assignee: Volley Boast, LLC, Houston, TX (US)

( * ) Notice: Subject to any disclaimer, the term of this patent is extended or adjusted under 35 U.S.C. 154(b) by 303 days.

(21) Appl. No.: 17/447,692

(22) Filed: Sep. 14, 2021

(65) Prior Publication Data

US 2023/0084512 A1    Mar. 16, 2023

(51) Int. Cl.
| | |
|---|---|
| H02H 9/00 | (2006.01) |
| H05K 7/20 | (2006.01) |
| H02H 9/02 | (2006.01) |
| H01R 27/00 | (2006.01) |
| H05K 5/06 | (2006.01) |
| H05K 5/00 | (2006.01) |
| H01R 31/06 | (2006.01) |
| H01R 13/631 | (2006.01) |

(52) U.S. Cl.
CPC ......... *H05K 7/20463* (2013.01); *H01R 27/00* (2013.01); *H01R 31/06* (2013.01); *H02H 9/008* (2013.01); *H02H 9/02* (2013.01); *H05K 5/0069* (2013.01); *H05K 5/064* (2013.01); *H01R 13/631* (2013.01); *H05K 5/0039* (2013.01)

(58) Field of Classification Search
None
See application file for complete search history.

(56) References Cited

U.S. PATENT DOCUMENTS

| | | | | | |
|---|---|---|---|---|---|
| 3,631,264 | A | * | 12/1971 | Morgan | H02H 9/008 361/111 |
| 5,838,589 | A | * | 11/1998 | Nail | H02H 9/008 700/286 |
| 6,397,322 | B1 | * | 5/2002 | Voss | H02H 9/008 340/532 |
| 10,862,297 | B2 | * | 12/2020 | Pilz | H04Q 9/02 |
| 2015/0366084 | A1 | * | 12/2015 | Arul | H01R 24/48 361/752 |

* cited by examiner

*Primary Examiner* — Stephen W Jackson
(74) *Attorney, Agent, or Firm* — Duncan Galloway Greenwald PLLC; Kevin T. Duncan

(57) ABSTRACT

A new and improved intrinsically safe barrier ("ISB") provides advantages in connection with installation of field equipment in hazardous areas including Division 2/Zone 2 areas. In one embodiment the new ISB provides a pluggable/unpluggable ISB for use with a receiving terminal base adapted for individual field mounting and alternatively for use with a circuit mount terminal base to permit direct mounting of ISB on circuit boards. A highly effective heat sink design and potting material allows for heat dissipation to allow the ISB to serve a wider range of applications.

15 Claims, 16 Drawing Sheets

Schematic "A" - 1-channel/2-wire application

Schematic "B" - 2-channel/3 or 4-wire voltage operated device type connection

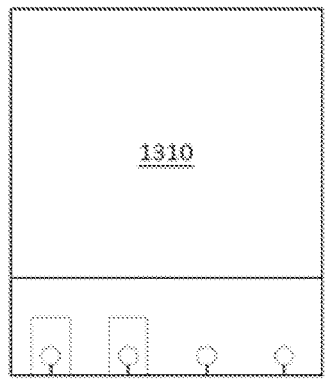 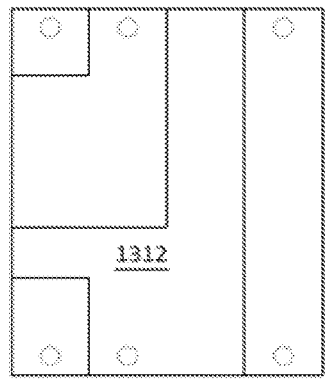 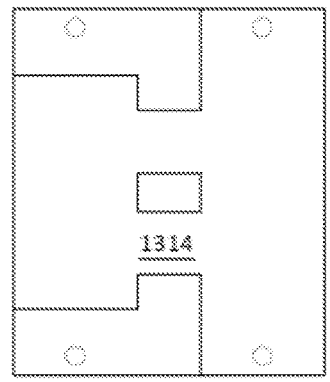
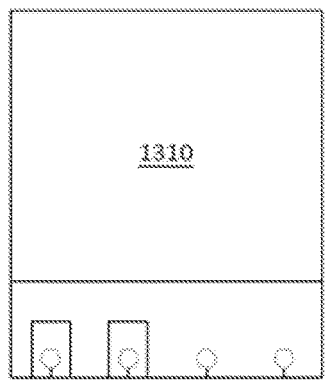 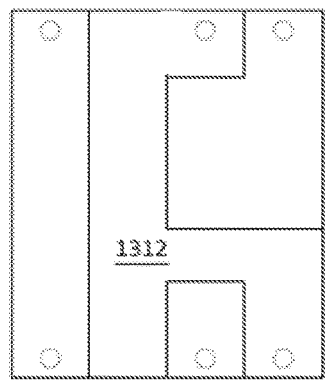 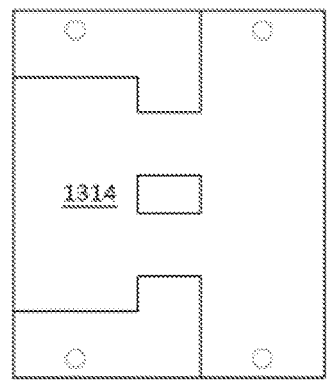
RESISTOR BOARD     FUSE/DIODE BOARD     RS-485 BOARD
Schematic "A/B" Boards     Schematic "C"
FIG. 13     FIG. 14     FIG. 15

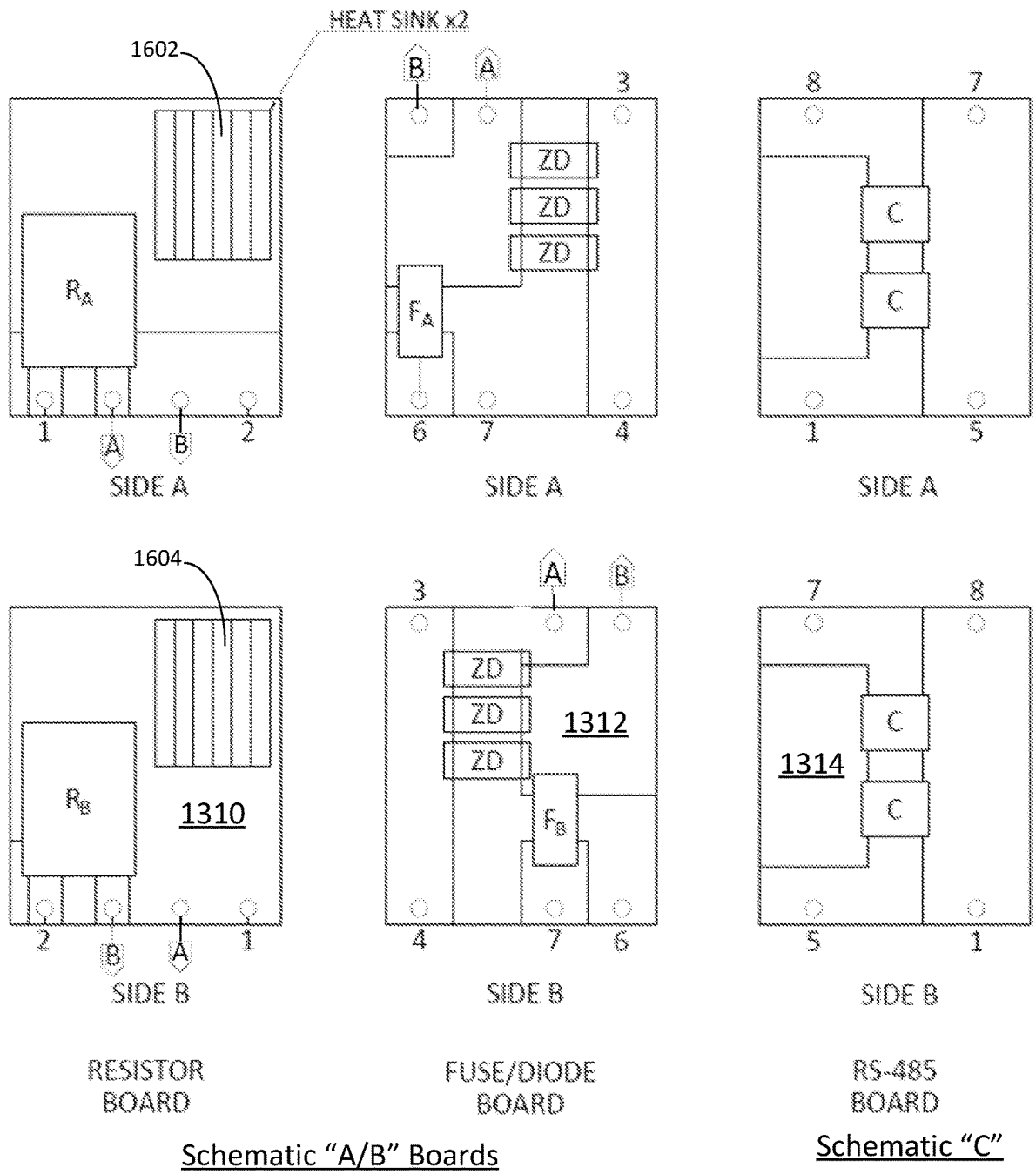

Schematic "D" - Single Channel/3-wire device voltage operated

PLUGGABLE INTRINSICALLY SAFE BARRIER

FIELD OF INVENTION

The present invention generally relates to the field of providing intrinsically safe equipment for use in hazardous locations. More particularly the present invention relates to barriers for use in transmitting intrinsically safe sensor, control, digital and analog signals into hazardous areas, such as for use through the wall of a safe area rated for Division 2/Zone 2 area enclosure.

BACKGROUND

The present invention is designed for use in hazardous locations to prevent injury to persons and damage to equipment, e.g., from explosions caused when electrical signals, which may cause a spark, encounter hazardous or dangerous conditions such as combustible or ignitable fluids, liquids, vapors, gases, dusts and other flammable or explosive materials (collectively "hazardous materials"). Hazardous locations include areas having a potential for fire or explosion caused by the presence of electrical equipment required in such locations to operate and control and monitor equipment contained in such areas and potentially coming in contact with hazardous materials. This electrical equipment by nature involves electrical communication of electrical signals, such as power, control and sensor related signals of a wide range of voltage and current levels and frequencies. Such electrical signals, if not properly shielded, enclosed and protected from ambient transmission, may react with hazardous materials.

Different levels of risk exist in different hazardous location environments involving different hazardous materials. Hazardous locations or areas have been classified by different governing bodies, e.g., National Fire Protection Association (NFPA), National Electrical Manufacturers Association (NEMA), and Underwriters Laboratories (UL). In the U.S., NFPA 70 is the National Electrical Code (NEC) and is the benchmark for safe electrical design, installation, and inspection and is designed to protect people and property from electrical hazards; it has been adopted in all 50 states. The NEC established a Class/Division system to segregate levels and types of hazards, i.e., Class I, Divisions 1 and 2; Class II, Divisions 1 and 2; and Class III, Divisions 1 and 2. In Europe, regulations defining and classifying hazardous locations are governed by the International Electrotechnical Commission (IEC), the European Committee for Electrotechnical Standardization (CENELEC), the British Standards Institution (BSI), Deutsches Institut für Normung (DIN), and Association Francaise de Normalisation (AFNOR) and have established a "Zone" system (Zones 0, 1, and 2) to differentiate hazards. Article 505 of the NEC harmonizes with the Zone system by adapting it into the Class/Division framework. The Canadian Electrical Code (CEC) and other such codes exist in other countries and many largely correspond with U.S. NEC and European counterparts. Intrinsically Safe Systems may be used in all three NEC classes whether applying the division system or zone system.

Governments enact laws and administrative regulations that specify compliance with codes and standards. For example, in the U.S., 29 CFR 1926 provides safety and health regulations in construction administered by the Occupational Safety and Health Administration. Subpart K covers electrical safety requirements. OSHA Standard No. 1926.449 sets forth definitions for Part Number 1926, which is incorporated herein by reference. Equipment and enclosures designed for use in hazardous locations may be referred to as "Explosion-Proof equipment" or "Intrinsically Safe Equipment" or "Dust Ignition Proof." For example, OSHA 1926.449 defines "Intrinsically safe equipment and associated wiring" as "Equipment and associated wiring in which any spark or thermal effect, produced either normally or in specified fault conditions, is incapable, under certain prescribed test conditions, of causing ignition of a mixture of flammable or combustible material in air in its most easily ignitable concentration." OSHA 1926.449 defines "Enclosure" as "The case or housing of apparatus, or the fence or walls surrounding an installation to prevent personnel from accidentally contacting energized parts, or to protect the equipment from physical damage." And OSHA 1926.449 defines "Signaling circuit" as "Any electric circuit that energizes signaling equipment." Equipment for use in hazardous locations are further classified and/or specified and/or certified by industry and governmental groups.

"Intrinsic safety" refers to a low-energy signaling technique for preventing energy over a threshold from being delivered into a hazardous area and is the subject of Article 504 of the NEC. The threshold, below which energy is permitted into the hazardous area, is the energy that would be sufficient to cause ignition, combustion or an explosion. Intrinsic safety is an approach that prevents low-voltage devices or circuits in hazardous areas from releasing excessive energy to prevent ignition of volatile gases.

"Intrinsically Safe Systems" ("ISS") are essentially circuits made up of components that are either in "safe" areas or are in "hazardous" areas (field devices) with those respective areas, or inputs and outputs from those areas, separated by an "Intrinsically Safe Barrier" ("ISB") also known as an intrinsically safe associated apparatus. A "safe" area is a non-hazardous area or location or an area inside an enclosure rated appropriate for the surrounding environment. The ISB prevents energy, usually in the form of excessive voltage or heat, from being passed from a safe area into a hazardous area. Equipment for use in an ISB are also subject to temperature classifications to operate within temperature ranges established to prevent excessive heat from igniting gases. This is particularly useful in permitting maintenance of instrumentation equipment within hazardous areas. Wiring, cabling and conductors associated with such equipment are also subject to these classifications.

Although ISBs are circuits that limit current, voltage and power and are commonly made up of a mix of current limiting resistors, Zener diodes (coupled to short circuit to an intrinsically safe ground), and fuses. The configuration and ratings of the components can be complex and critical to provide both protection and effective operation of the circuit and connected field equipment.

In the prior art, barriers used a DIN rail mounting system for ganging the barriers side by side. A DIN (name derived from German standards setting organization) rail is an elongated metal rail well known and widely used for mounting circuit breakers and industrial control equipment inside equipment racks and are used for support and not for conducting signals or power. Examples of prior art ISBs used as intrinsically safe interfaces with field devices in hazardous areas having DIN rail mounts include: the 937Z provided by Allen-Bradley; Intrinspak series 9001/9002/9004; and the MTL700 and MTL7700 shunt-diode safety barriers provided by Crouse-Hinds. An example of a prior art Zener ISB is shown in FIG. 1 in which Zener barrier 10 is shown snapping on to the DIN rail mount 20. Typically, a series of ISBs are gang-mounted closely together on the DIN rail.

FIG. 2 illustrates an exemplary prior art arrangement of prior art ISB receiving an input signal from a source in a safe area and outputting a signal to a two-wire field device located in a hazardous area. The ISB limits the current and voltage output to the field device in the hazardous area to a level lower than what would be necessary to ignite a flammable or volatile substance in that area.

FIG. 3 illustrates an exemplary prior art three-wire sensor located in a hazardous area connected to a prior art ISB located in a safe area (which may be inside an enclosure rated for hazardous location). The ISB limits the current and voltage output to the field device (3-wire sensor) in the hazardous area to a level lower than what would be necessary to ignite a flammable or volatile substance in that area.

Prior art ISBs employ circuitry that relies on an array of resistors to spread the drop across a plurality of resistors. Although using an array of low power resistors reduces heat by distributing the drop across many resistors, it comes with the disadvantage of voltage drop/loss which limits the range of supply voltages the ISB is capable of handling.

A first significant problem with this prior art ISB is this arrangement is not suitable for individually mounting or direct circuit board mounting. This results in less flexibility in the use of ISBs where desired for individual use or for direct circuit board mounting. What is needed is an ISB that provides a versatile packaging and installable structure configured for individual and direct circuit board mounting.

A second significant problem with prior art ISBs is they are very large and do not lend themselves to circuit board integration or remote mounting and take up excessive space in many applications. The metal also provides a potential cause for sparking—unwanted in hazardous locations. What is needed is an ISB that provides an installable structure having a reduced footprint and that has a reduced reliance on metallic DIN mounting rails.

A third significant problem with prior art ISBs is they require all wiring to be removed to replace a barrier. This requires extensive onsite effort, is very labor intensive and leads to down time in the operation of field equipment. This approach also raises safety concerns and slows field replacement, e.g., increases the opportunity for mistakes in removing wires and re-installing them. What is needed is an ISB providing a field installable structure that allows replacement of ISB without requiring all wiring to be removed.

A fourth significant problem with the prior art ISB is due to the resistor design used it is not capable of handling a wider range of supply voltages. For current limiting purposes, higher resistance is lower heat, but has a commensurate higher voltage drop/loss. This shortcoming results in requiring more ISB models to handle different and more limited voltage ranges. What is needed is an ISB capable of using a more versatile design that allows use over a wider range of supply voltages to reduce the required number of product models needed to address the range of applications encountered.

SUMMARY OF THE INVENTION

The present invention provides a comprehensive redesign of what would be considered a conventional DIN mounted ISB barrier. The present invention provides, in one embodiment, an ISB having a hollow body, for example cylindrical, with a base having a plurality of pins allowing the ISB to be mounted into 1) a surface-mounted screw terminal base or 2) directly integrated into a circuit board. In both circuit configurations, the new ISB provides a pluggable base capable of easy removal and replacement. The present invention ISB uses a high wattage resistor with a robust circuit board heat sink and heat conducting polymer to pull the heat away from the electronics and reduce the possibilities of any so-called "hot spots." The present invention addresses and overcomes the shortcomings of the prior art in a number of highly desirable ways to improve the state of the art in ISB design and products.

An example of an application having use for the invention is industrial applications involving volatile gases or fluids, e.g., wellhead monitoring sensors and control devices connected to control room systems, PLCs, FPGAs and other equipment.

A first advantage, the present invention provides a versatile packaging and installable structure configured for individual and direct circuit mounting. The versatile pluggable base on the invention permits alternative connections to 1) a terminal base or receptacle having a set of field wired terminals corresponding to leads on the pluggable base (including for DIN rail mounting), or 2) via an intermediate female receiving component (e.g., a multi-pin socket) having a set of terminals for circuit board mounting. In both arrangements the pluggable ISB is capable of being removed by simply unplugging the pluggable ISB from either type of receiving base.

A second advantage, the present invention provides an installable structure having a reduced footprint and that has a reduced reliance on metallic DIN mounting rails. The pluggable ISB of the present invention provides the further advantage of having a reduced footprint. Individual mounting reduces the need for a DIN mounting rail structure, and permits localized mounting of an ISB at a field device, e.g., a sensor.

A third advantage, the present invention provides a field installable structure that allows replacement of ISB without requiring all wiring to be removed. The new invention allows for pluggable barriers to make replacement safer and faster. The pluggable/unpluggable design avoids the potential for mistakes made in removing wires and re-installing them as is typically the case with DIN rail mounted ISBs of the prior art.

A fourth advantage, the present invention provides a more versatile design that allows use over a wider range of supply voltages. The present invention takes a different approach to current limiting. The new design incorporates a high wattage power resistor and larger area heat sink (copper content on circuit board) with the inclusion of heat conductive potting for dissipating heat more uniformly and reducing the resistance to improve voltage throughput resulting in lower voltage drops and wider range of applications. The redesign obviates the need for low heat/higher resistance and reduces voltage drop/loss as compared to the ISBs of the prior art. In this manner the present invention provides a design capable of requiring a reduced number of product models needed to address the range of applications encountered.

By having the electronic circuit disposed within a hollow portion of a cylindrical coupler housing and encapsulated by a potting material, the invention provides enhanced heat dissipation properties. In consideration of the intended use of the coupler device in a hazardous area enclosure potentially exposed to explosive gases, heat dissipation for the electronic circuit components in the housing is critical. By separating circuit elements, the potting material separately covers the elements to promote heat dissipation. To provide additional heat dissipation properties, the electronic circuit provides enlarged heat sinking capabilities on the board arrangement to further disperse heat loading.

In a first implementation the present invention provides an Intrinsically Safe Barrier ("ISB") for allowing electrical transmission of an electrical signal between a safe area and a field device in a hazardous area, the ISB comprising: a coupler housing having a hollow interior portion adapted to receive a set of one or more printed circuit boards collectively forming an ISB circuit, the housing being made of a fire retardant material rated UL94V0; a set of Zener diodes mounted on the set of one or more printed circuit boards and electrically connected between a supply voltage and an intrinsically safe ground, the set of Zener diodes configured to provide a clamping voltage to shunt to ground any signal greater than the clamping voltage and to permit a signal lower than the clamping voltage to pass to a field device located in a hazardous area; a current limiting circuit board from the set of one or more printed circuit boards having a UL94V0 rated laminate layer, and having a high wattage power resistor disposed thereon to limit current to the field device and to the set of Zener diodes, and further comprising a heat sink arranged to dissipate heat associated with a voltage drop across the power resistor, and wherein the power resistor is configured to have a relatively low resistance value and low voltage drop in the ISB; and a thermally conductive potting material disposed in the hollow interior portion of the housing and being in direct thermal contact with the current limiting circuit board and the ISB housing, whereby heat dissipated by the heat sink of the current limiting circuit board is further dissipated in the potting material and the ISB housing.

The first implementation may be further characterized in one or more of the following manners: wherein the resistor is rated at or about 300 ohms and 45 Watts; further comprising a plug comprising a set of pins at one end and at the other end a set of connectors for connecting with the ISB circuit, the plug configured to attach to an end of the ISB housing with the set of pins projecting outward from the ISB housing and the set of connectors facing inward toward the hollow interior portion, whereby with the potting material disposed in the interior of the housing the material encapsulates the set of connectors; wherein the plug is configured to mate with a socket, the socket having a set of terminals configured to physically and electrically align with the set of pins of the plug, and wherein the plug is in a pluggable/unpluggable relation with the socket to avoid wire manipulation in making or unmaking a connection with the socket; wherein the plug is an 8-pin octal plug and the socket is an 8-terminal octal socket and wherein the plug includes a guide member having a key guide and the socket includes a central receiving opening and recess into which the guide member and key guide are matingly aligned and received to insure proper alignment of the set of pins with the set of terminals; wherein the ISB circuit further comprises at least one fuse connected to the supply voltage to provide for over-current protection; wherein the housing is made of one from the group consisting of epoxy resin rated UL-94-V0, stainless steel, aluminum, and Bakelite; wherein the set of one or more circuit board is configured to either connect with a two-wire field device or to connect with a three-wire field device; wherein the set of one or more printed circuit boards further comprises a set of capacitors configured to permit passing of a high frequency signal between the ISB and the field device; wherein the current limiting circuit board further comprises a copper layer, wherein the copper layer is configured as a heat sink to dissipate heat associated with a voltage drop across the power resistor and includes 2 oz. copper over a majority of the board as a heat conductive sink for the power resistor.

In a second implementation, the present invention provides a pluggable/unpluggable ISB system for allowing electrical transmission of an electrical signal between a safe area and a field device in a hazardous area, the ISB system comprising: an ISB plug component comprising: a coupler housing having a hollow interior portion adapted to receive a set of one or more printed circuit boards collectively forming an ISB circuit, the housing being made of a fire retardant material rated UL94V0; a set of Zener diodes mounted on the set of one or more printed circuit boards and electrically connected between a supply voltage and an intrinsically safe ground, the set of Zener diodes configured to provide a clamping voltage to shunt to ground any signal greater than the clamping voltage and to permit a signal lower than the clamping voltage to pass to a field device located in a hazardous area; a high wattage power resistor disposed on a portion of the set of one or more printed circuit boards having a UL94V0 rated laminate layer and a heat sink disposed thereon in thermal conduction with the resistor, the resistor configured to limit current to the field device and to the set of Zener diodes, wherein the heat sink dissipates heat associated with a voltage drop across the power resistor, and wherein the power resistor is configured to have a relatively low resistance value and low voltage drop in the ISB; a thermally conductive potting material disposed in the hollow interior portion of the housing and being in direct thermal contact with the set of one or more printed circuit boards and the ISB housing, whereby heat dissipated by the heat sink of the set of one or more printed circuit boards is further dissipated in the potting material and the ISB housing; and a plug comprising a set of pins at one end and at the other end a set of connectors for connecting with the ISB circuit, the plug configured to attach to an end of the ISB housing with the set of pins projecting outward from the ISB housing; and an ISB socket component comprising: a set of terminals configured to physically and electrically align with the set of pins of the plug; wherein the ISB plug is in a pluggable/unpluggable relation with the ISB socket to avoid wire manipulation in making or unmaking a connection with the ISB socket.

The second implementation may be further characterized in one or more of the following manners: wherein the ISB socket is configured to mount on to a circuit board to permit the ISB plug to direct connect with a circuit board; wherein the ISB socket component is configured to surface mount to a structure and includes a set of terminals to facilitate field termination of wires between the ISB socket and a field device; wherein the ISB plug component is an 8-pin octal plug having a guide member and a key guide and the ISB socket component is an 8-terminal octal socket having a central receiving opening and recess into which the guide member and key guide are matingly aligned and received to insure proper alignment of the set of pins with the set of terminals. The ISB system may further comprise a second ISB component and a second socket component, the second ISB component having a printed circuit board comprising a set of capacitors configured to permit passing of a high frequency signal between the ISB and a field device operatively connected via the second socket component.

BRIEF DESCRIPTION OF THE DRAWINGS

To facilitate a full understanding of the present invention, reference is now made to the accompanying drawings, in which like elements are referenced with like numerals. These drawings should not be construed as limiting the present invention but rather are intended to be exemplary and for reference in explaining operation of the present invention.

FIG. 5A provides a circuit diagram illustrating the schematic "B" ISB device or coupler in connection with a "three or four wire" configuration for use with a 4-20 mA type sensor/field device.

FIG. 5B provides a circuit diagram illustrating the schematic "B" ISB device or coupler in connection with a "dual channel" configuration for use with a voltage operated type sensor/field device.

FIG. 5C provides a circuit diagram illustrating the schematic "B" ISB device or coupler in connection with a "three or four wire" configuration for use with a pulsed or pulsating flow meter or counter type field device.

FIGS. 13-14 illustrate a second exemplary set of unpopulated PCB layouts associated with schematic "A" and "B" embodiments of the present invention including a resistor board configured for use with a heat sink.

FIG. 15 illustrates an exemplary unpopulated PCB capacitor board layout associated with a RS485 schematic "C" embodiment of the present invention.

FIGS. 16-17 illustrates an exemplary set of component-populated PCB layouts (resistor board (FIG. 16) and fuse/diode board (FIG. 17)) associated with schematic "A" (side A only) and schematic "B" (sides A and B) embodiments of the present invention including a resistor board having a heat sink on one or both sides.

FIG. 18 illustrates an exemplary populated PCB capacitor board layout associated with a RS485 schematic "C" embodiment of the present invention.

DETAILED DESCRIPTION

The present invention will now be described in more detail with reference to exemplary embodiments as shown in the accompanying drawings. While the present invention is described herein with reference to the exemplary embodiments, it should be understood that the present invention is not limited to such exemplary embodiments. Also, while the exemplary embodiments describe use of exemplary discrete component configurations, this is not necessarily limiting to the invention and one possessing ordinary skill in the art would understand the invention may be used in connection with other configurations of discrete components having ratings effective in connection with the processes described in detail hereinbelow. Those possessing ordinary skill in the art and having access to the teachings herein will recognize additional implementations, modifications, and embodiments, as well as other applications for use of the invention, which are fully contemplated herein as within the scope of the present invention as disclosed and claimed herein, and with respect to which the present invention could be of significant utility.

Figure 1:
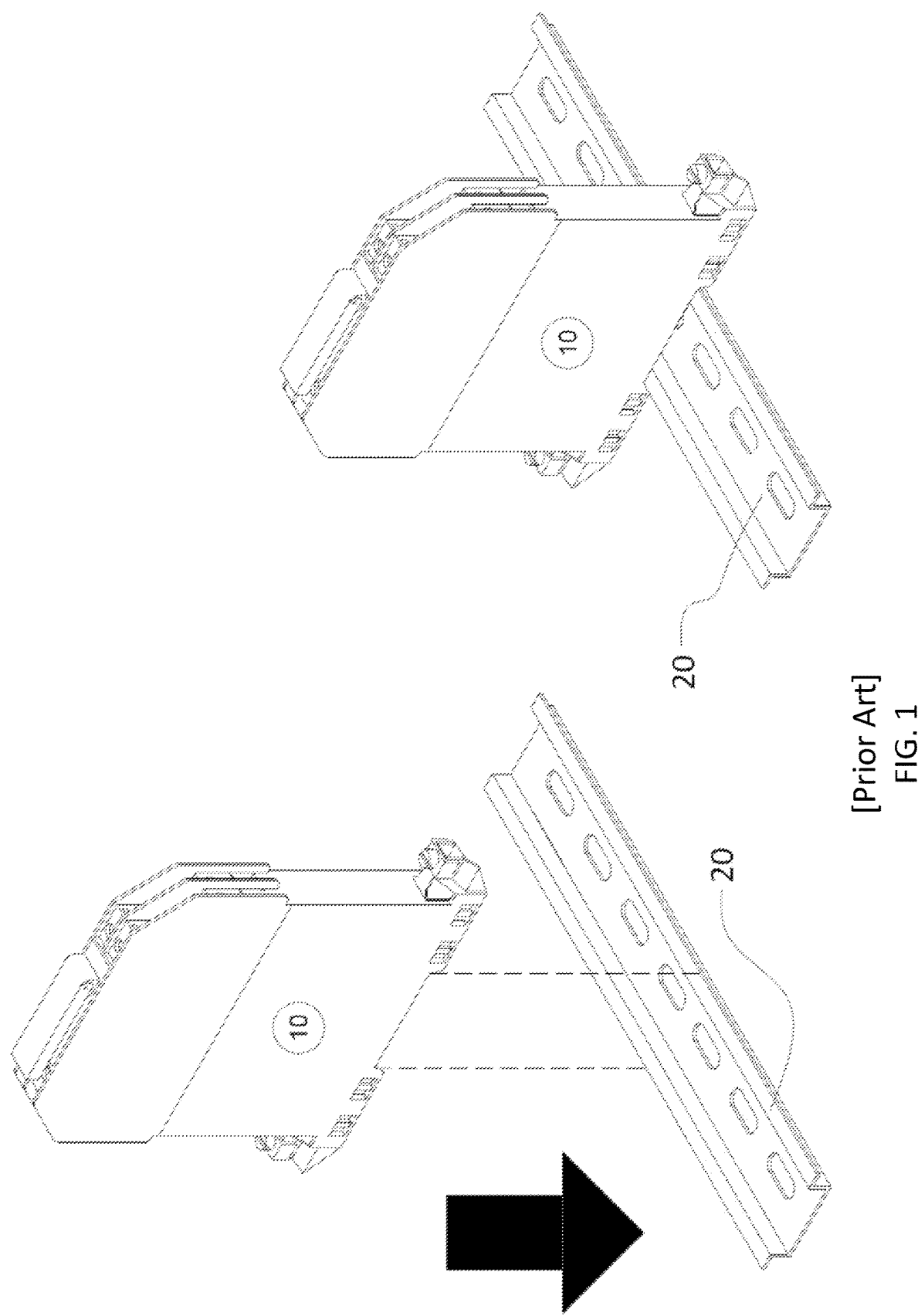
FIG. 1 provides views of a prior art DIN rail mounted ISB.
Figure 2:
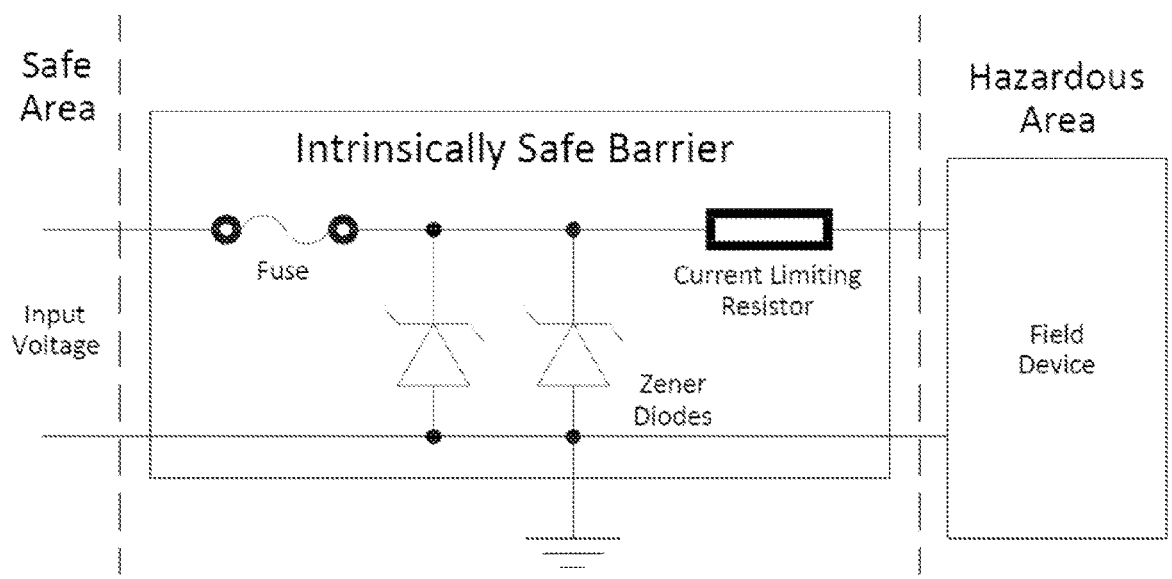
FIG. 2 provides a schematic view of a prior art ISB solution.
Figure 3:
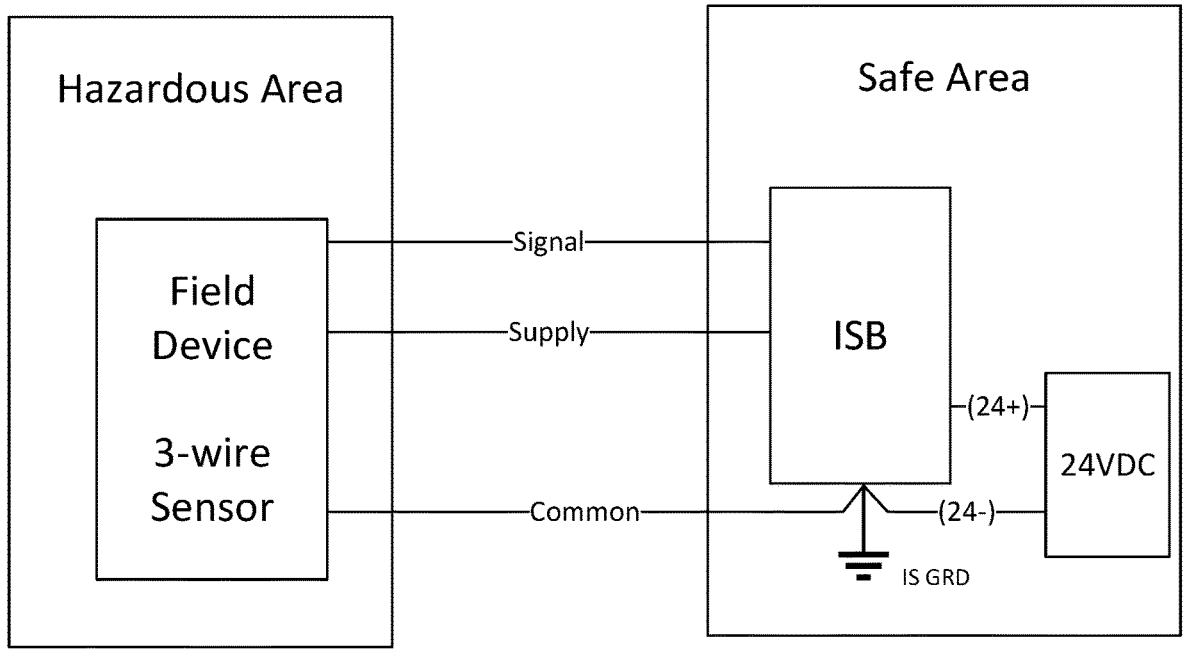
FIG. 3 provides a schematic of a prior art three-wire sensor as field device in a prior art ISB solution.
Figure 4:
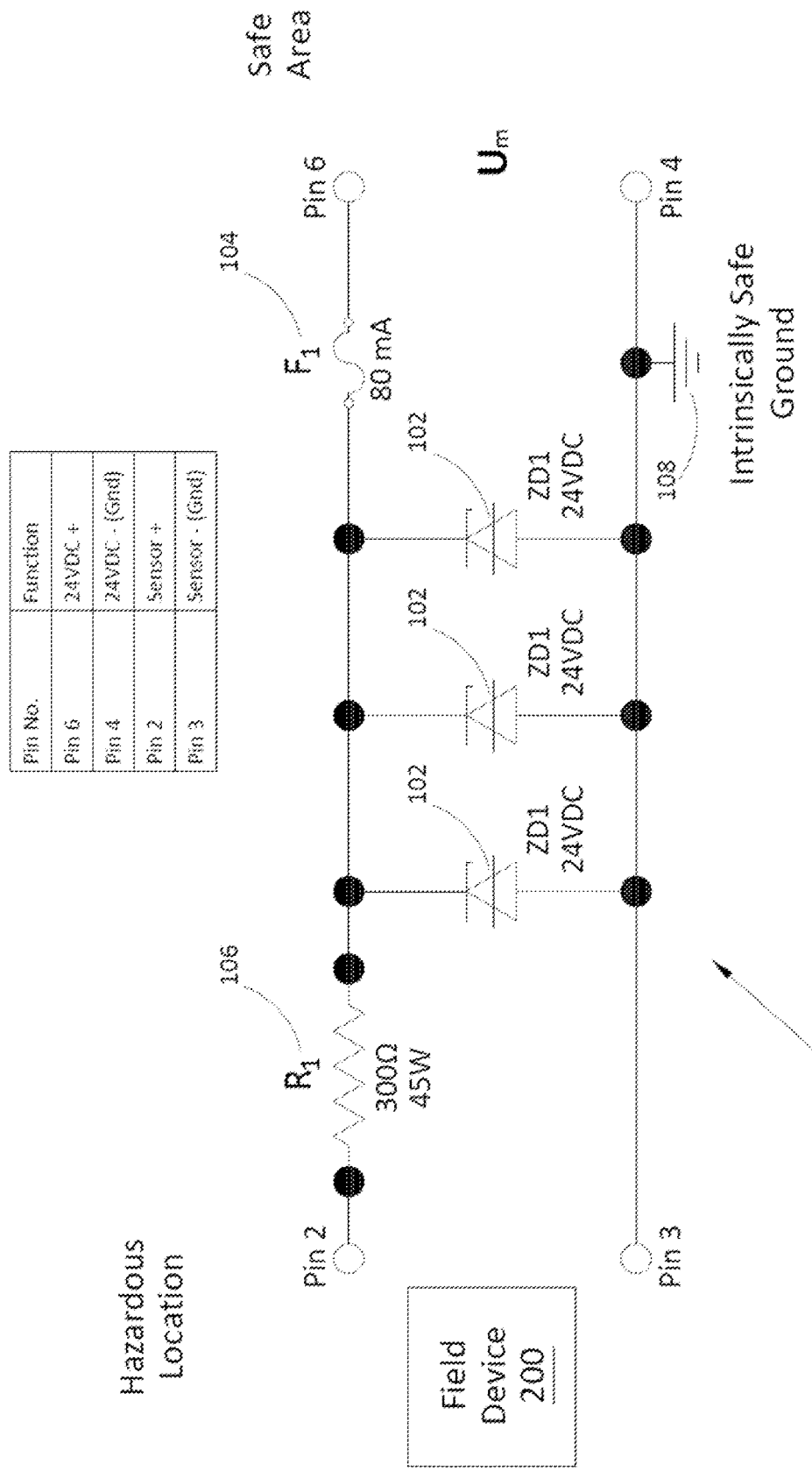
FIG. 4 provides a circuit diagram illustrating an exemplary ISB device or coupler configured as a schematic "A" circuit for use in a single-channel, 2-wire application in accordance a first embodiment of the present invention.
Figure 5A:
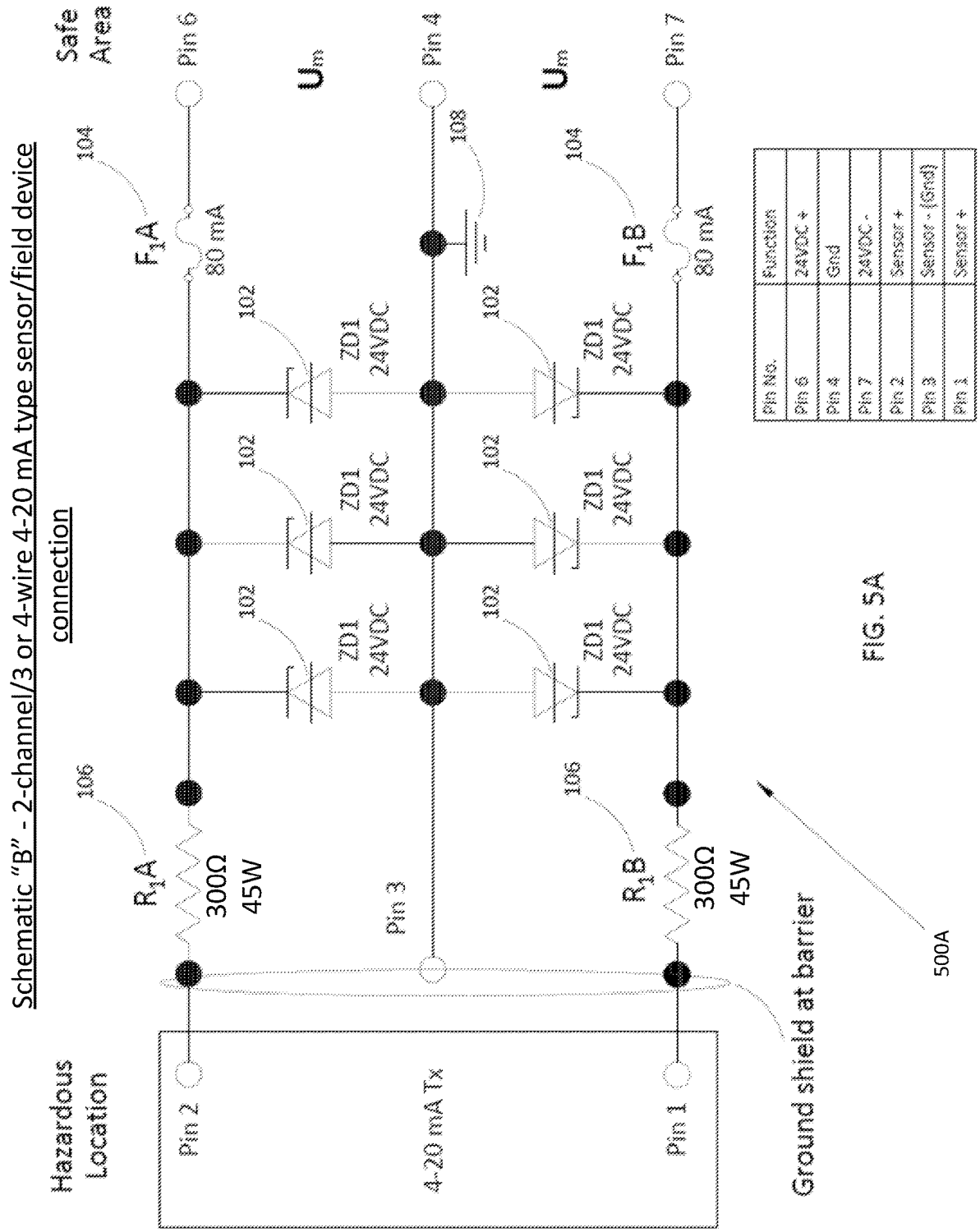
FIGS. 5A-5C illustrate three applications of a schematic "B" ISB device in accordance with a second embodiment of the present invention.
Figure 5B:
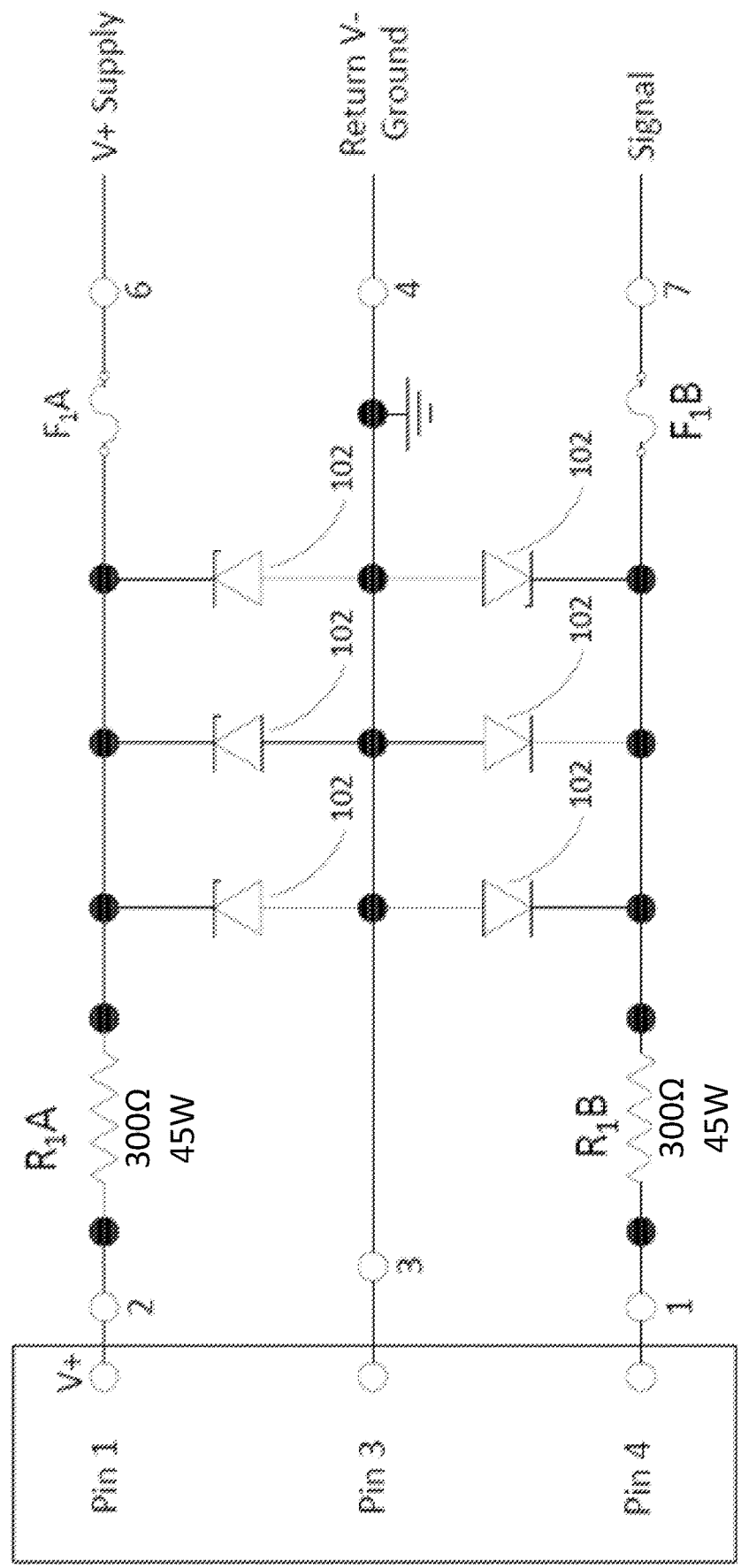
Figure 5C:
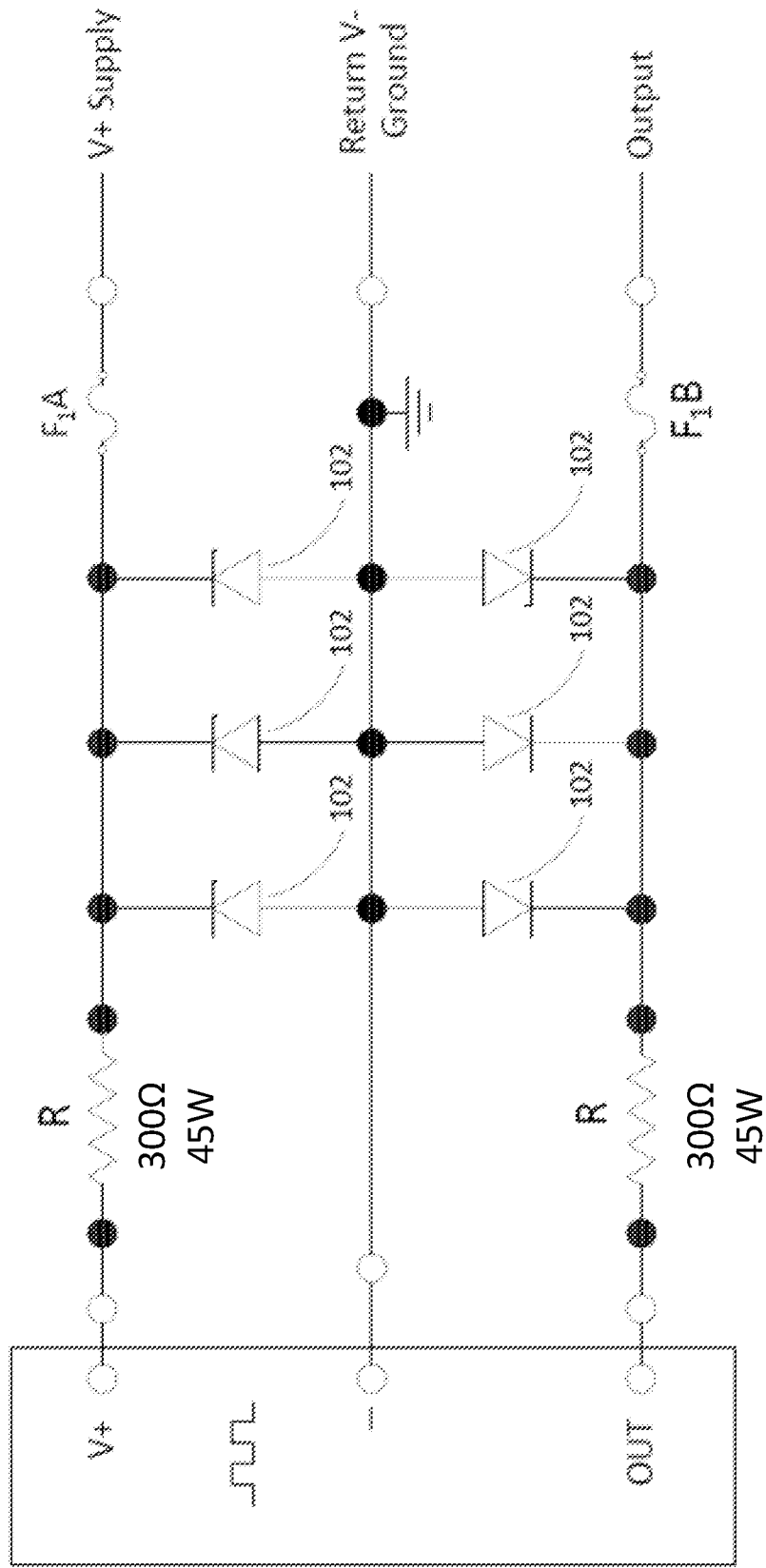
Figure 6:
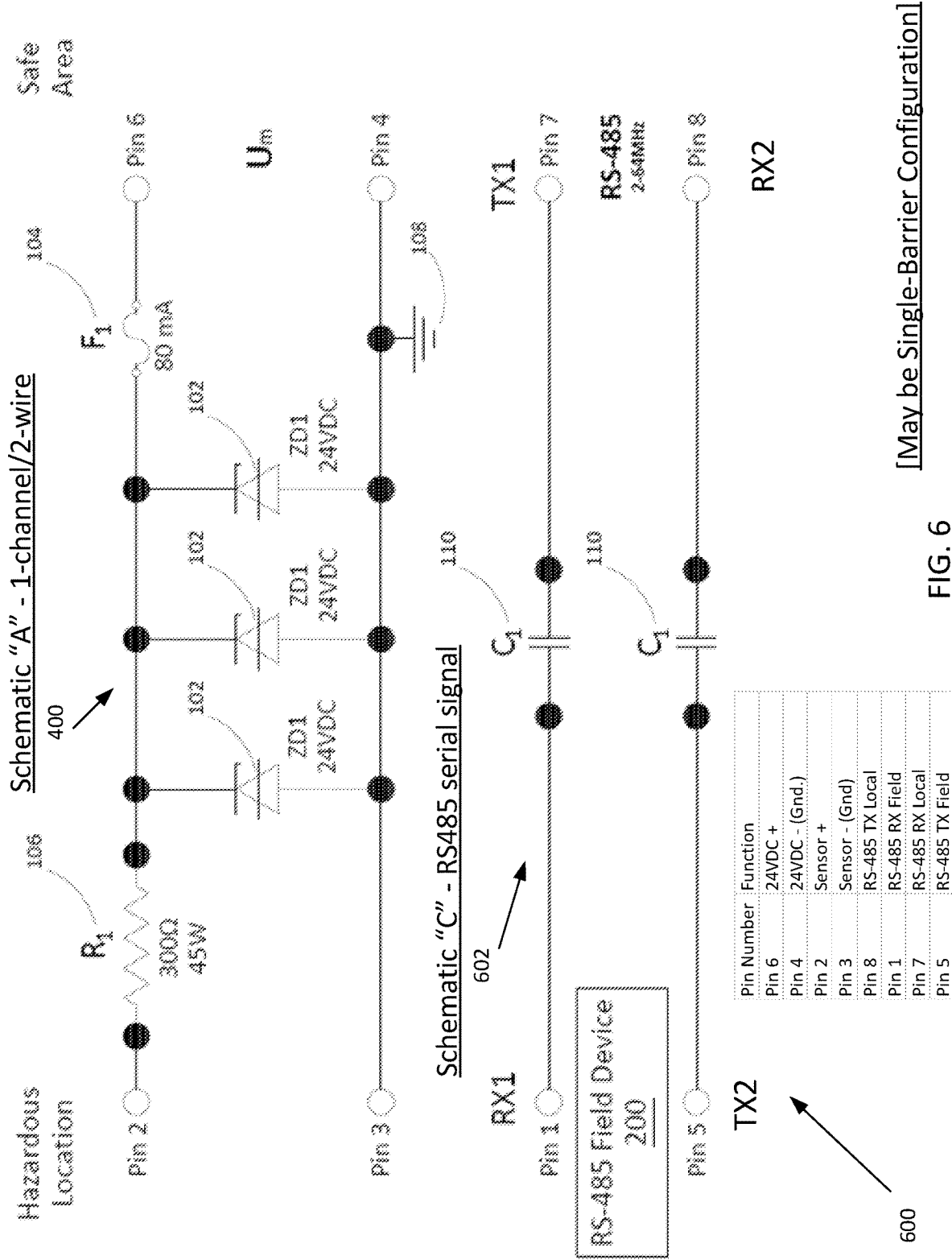
FIG. 6 provides a circuit diagram illustrating a further exemplary ISB device or coupler configured to combine the schematic "A" single-channel circuit with a schematic "C" RS-485 type circuit in accordance with a third embodiment of the present invention.
Figure 21:
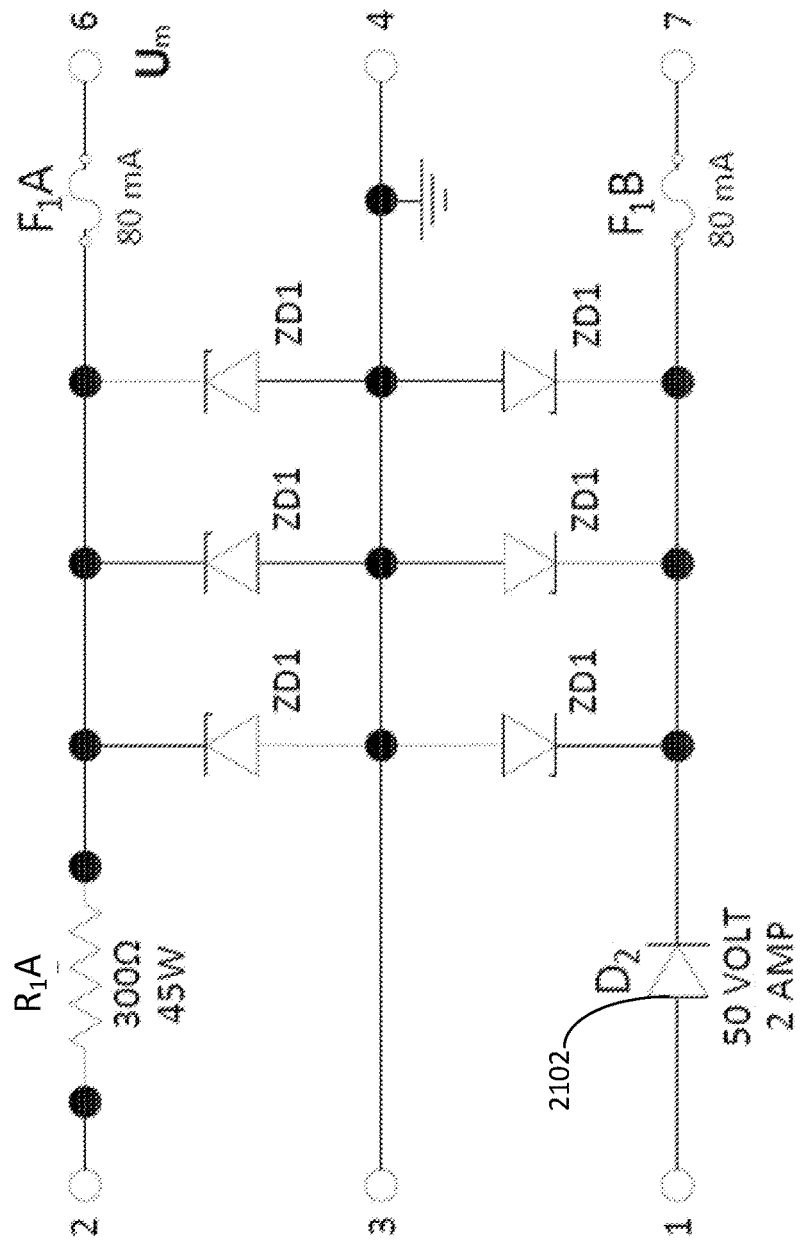
FIG. 21 illustrates an alternative embodiment ISB schematic circuit "D" for use as an ISB in connection with a single-channel, 3-wire voltage operated device application.
Figure 22:
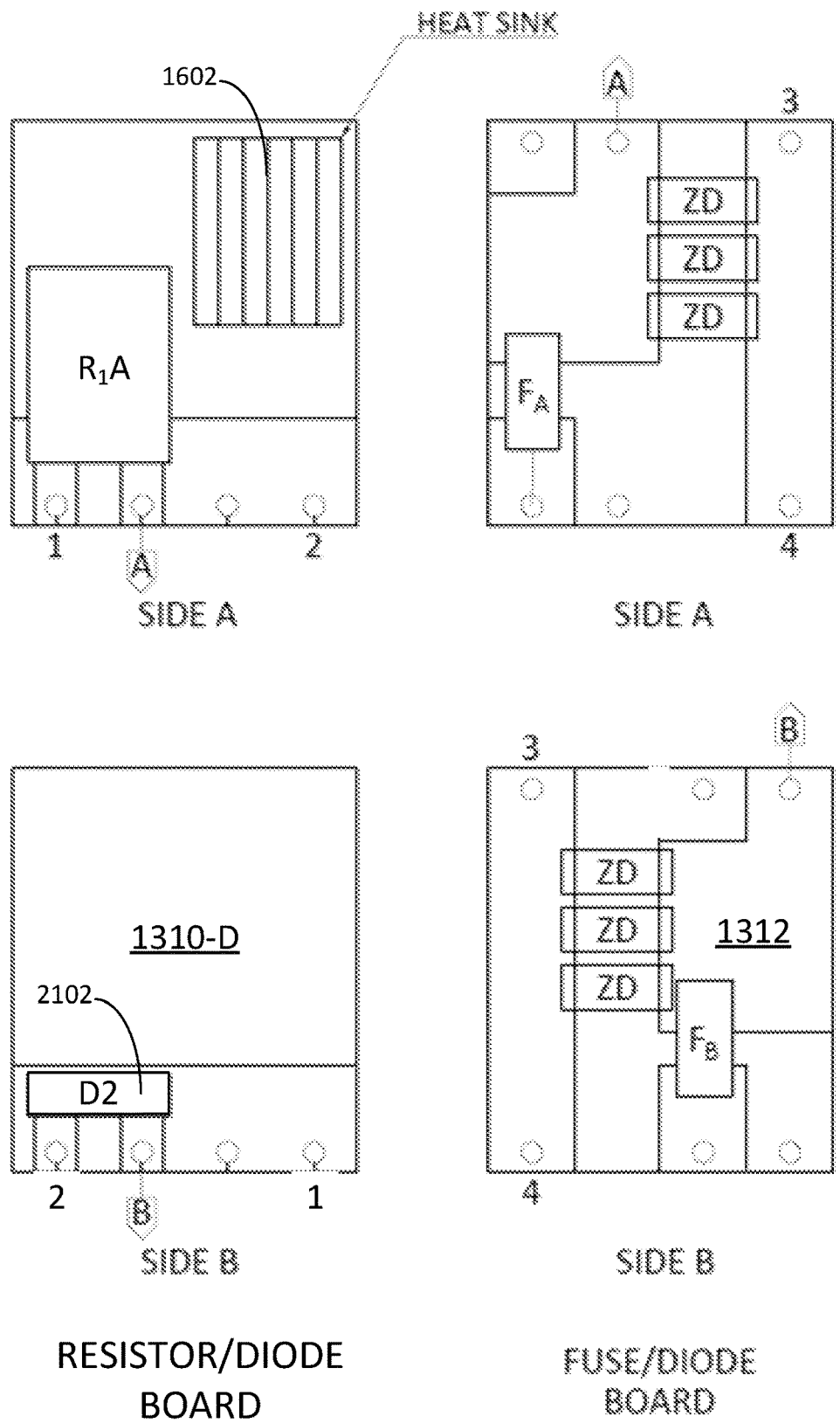
FIG. 22 illustrates board layouts associated with the schematic circuit "D" of FIG. 21 for assembly with ISB housing and plug components.

FIGS. 4-6 provide views of ISB circuits in accordance with three exemplary embodiments of the present invention identified generally as schematics "A", "B", and "C." FIGS. 21 and 22 provide views of a fourth embodiment ISB device identified as schematic "D."

FIG. 4 provides a circuit diagram illustrating an exemplary ISB device or coupler configured as a schematic "A" circuit for use in a single-channel, 2-wire application in accordance a first embodiment of the present invention. With reference to FIG. 4, an ISB 400 comprises an electrical circuit having, in this two-wire sensor or device example, three Zener diodes ZD1 102, a fuse F1 104, and a current limiting resistor R1 106. With the supply current less than 80 mA the power in $P_i$ is less than 1.12 Watts. The resistor maximum wattage is calculated as $1.5(1.7*0.08)^2*(300)$ to be 8.32 Watts.

Figure 7:
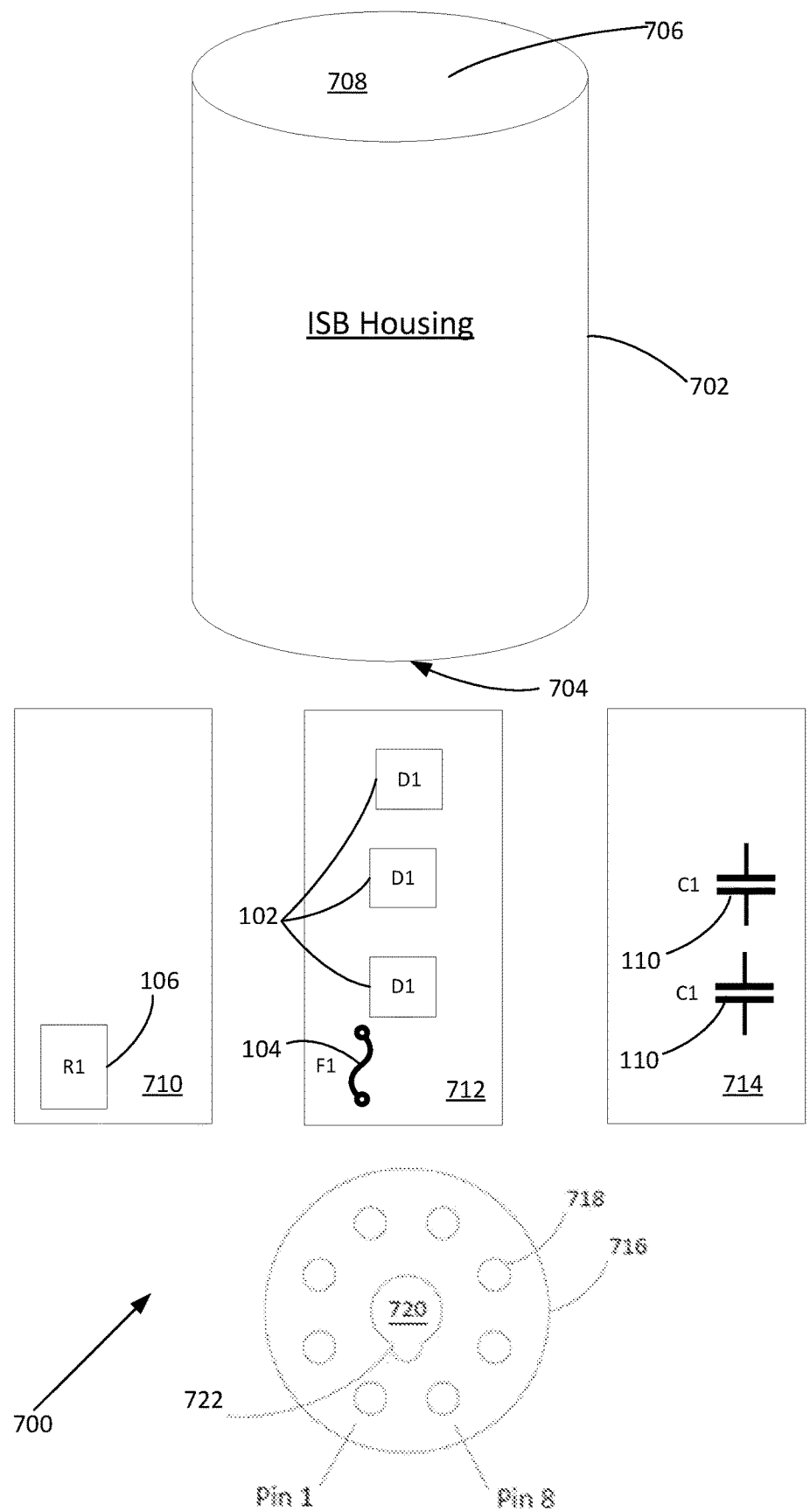
FIG. 7 provides a schematic view of a multi-board version of a pluggable/unpluggable ISB device or coupler in accordance with the combined circuit of FIG. 6 having an 8-pin octal plug base.

The pin layout corresponds, in this example, with the 8-pin plug configuration of pluggable/unpluggable ISB 700 of FIG. 7. Pins 2 and 3 are connected to an external field device 200, such as a sensor located in a hazardous location. Pins 4 and 6 are connected to a supply voltage $U_m$, e.g., 24 VDC. With the supply current being, for example, less than 80 mA the power in $P_i$ is less than 1.12 Watts. Resistor R1 106 is a rated at 300 ohms and 45 watts power, e.g., part TKH45P300RFE-TR available from Ohmite Manufacturing Company. Fuse F1 104 is a fuse encapsulated for hazardous locations such as model 0242-080-H rated at 80 mA, 4000 Amp interrupt rated at 250 VAC/VDC available from Littlefuse, Inc. Zener diodes ZD1 102 are operatively connected to intrinsically safe ground 108 to protect the circuit from high voltage/high energy transients. Zener diodes 102 provide a clamping voltage and are rated for controlling 24 VDC with operating power of 5 watts and peak pulse power dissipation (PPD) at 600 watts, e.g., part SMBJ24A available from Littlefuse, Inc. The calculated resistor maximum wattage equals $1.5(1.7*0.08)^2*(300)=8.32$ watts.

The Zener diodes 102 are configured to ensure the maximum voltage of the circuit output will not exceed the clamping voltage of the diodes, which is designed to be greater than the voltage levels of the signal. The clamping voltage of the diodes is determined by the voltage requirements of the field intrinsically safe sensor/device. A typical signal is under 24 volts, so the Zener diodes will permit the signal to pass through. If higher voltage signals are intended to be allowed to pass through, diodes with a higher clamping voltage would be selected.

FIGS. 5A-5C illustrate three applications of a schematic "B" ISB device in accordance with a second embodiment of the present invention. FIGS. 5A-5C illustrate three exemplary configurations (500A, 500B, 500C) of devices connected from hazardous locations to safe areas via the ISB of the present invention.

FIG. 5A provides a circuit diagram illustrating the schematic "B" ISB device or coupler 500A in connection with a "three or four wire" configuration for use with a 4-20 mA type sensor/field device. With reference to FIG. 5A, an ISB 500A comprises an electrical circuit having, in this three-wire sensor or device example, six (two sets of three) Zener diodes ZD1 102, two fuses F1A and F1B 104, and two 300 ohm current limiting resistors R1A and R1B 106, e.g., rated at 45 watts as manufactured by Ohmite having model number TKH45P300RFE-TR. Fuses F1A/B 104 are encapsulated for hazardous locations such as model 0242-080-H rated at 80 mA, 4000 Amp interrupt rated at 250 VAC/VDC available from Littlefuse, Inc. Zener diodes ZD1 102 are operatively connected to intrinsically safe ground 108 to protect the circuit from high voltage/high energy transients. Zener diodes 102 provide a clamping voltage and are rated for controlling 24 VDC with operating power of 5 watts and peak pulse power dissipation (PPD) at 600 watts, e.g., part SMBJ24A available from Littlefuse, Inc. The calculated resistor maximum wattage equals $1.5(1.7*0.08)2*(300)=8.32$ watts. Pins 4 and 6 are connected to a supply voltage $U_m$, e.g., 24 VDC. Typically, in a three-wire sensor three wires are used—two power wires and one "load" wire. The signals are protected in both directions, on the safe side the signal will be inputted to a Micro-Processor or a PLC or a Computer input, there will be signal conditioning to match the barrier output, such as specific PLC I/O or the input to a microprocessor. These components match the ratings and specifications described above. The pin layout corresponds, in this second example, with the 8-pin plug configuration of pluggable/unpluggable ISB 700 of FIG. 7. Pins 1, 2, and 3 are connected to an external field device 200, such as a three-wire type sensor located in a hazardous location. Pins 4, 6, and 7 are connected to a supply voltage $U_m$, e.g., 24 VDC for supplying a voltage to the connected three-wire type field device with intermediate current limiting resistors R1A/R1B 106 and fuses F1A/F1B 104. Respective sets of three Zener diodes 102 couple the three-wire outputs of the circuit to intrinsically safe ground 108 and provide a clamping voltage configured to ensure the maximum voltage of the circuit outputs will not exceed the clamping voltage of the diodes, which is designed to be greater than the voltage levels of the signals.

FIG. 5B provides a circuit diagram illustrating the schematic "B" ISB device or coupler 500B described above in connection with a "dual channel" configuration for use with a voltage operated type sensor/field device. FIG. 5B illustrates an exemplary voltage sensor configuration (0-5 V or 0-10 V).

FIG. 5C provides a circuit diagram illustrating the schematic "B" ISB device or coupler 500C described above in connection with a "three or four wire" configuration for use with a pulsed or pulsating flow meter or counter type field device. FIG. 5C illustrates an exemplary pulse flow meter powered with voltage supply configuration.

FIG. 6 provides a circuit diagram illustrating a further exemplary ISB device or coupler 600 configured to combine the schematic "A" single-channel circuit (ISB 400) with a schematic "C" RS-485 type circuit 602 in accordance with a third embodiment of the present invention. With reference to FIG. 6 an exemplary ISB coupler is configured for RS-485 type connection, for example transmission signals operating over Cat5 and Cat5e cables. In this configuration, pin 1 is connected with pin 7 via capacitor C1 110 for a first Rx/Tx path and pin 5 is connected with pin 8 via capacitor C1 110 for a second path. Collectively the first and second paths provide for (In/Out) RS-485 communications as well as other variations, e.g., Ethernet, Modbus RTU, RS-232 and RS-422 (TxD/RxD). As described above, supply voltage $U_m$ (24vdc) is connected to the ISB via pins 6 and 4 via fuse F1 104 limiting current to 80 mA with input power $P_i$ equal to or less than 1.12 Watt. The calculated resistor maximum wattage equals $1.5(1.7*0.08)^2*(300)=8.32$ watts. The Zener diodes 102 provide a voltage clamp short path to intrinsically safe ground 108. The Zener diodes shunt voltages above the clamping voltage to ground 108 providing isolation while permitting high frequency signals to pass through. Capacitive reactance or internal impedance (Xe) is an inverse function of AC signal frequency. The capacitors C1 110 provide 2.2 μF and with an oscillating signal at 2 MHz the capacitive reactance experienced on the signal is 0.072 ohms and with a signal at 64 MHz the capacitive reaction experienced on the signal is 0.002 ohms. Resistance at VDC (frequency=0) is effectively infinity ohms, i.e., open circuit. Capacitor C1 110, for example, may be obtained from Murata Electronics, XR7 Series, model number KCM55TR72A106MH01K.

Connections between field devices, safe area devices, and control room or other equipment present in safe and/or hazardous areas may involve transmission cabling, e.g., Cat5 or Cat5e industrial Ethernet cable capable of transmitting Ethernet signals on the order of 10 MHz to 1 GHz and 1-3V. It is understood that the cable will be whatever is suitable for the type of signal being transmitted. It is contemplated that a similar arrangement may be used for transmitting signals of 1 MHz to 1 GHz and up to 30V, with the cables being selected to be suitable for carrying the signals. Examples of field devices for connecting to one or more of the ISB configurations of FIGS. 4-6 are listed in the following table.

TABLE 1

List of Field Devices

| IS Sensors | Voltage Supply | Entity Parameters | | | | |
|---|---|---|---|---|---|---|
| | | $V_{max}$ | $I_{max}$ | $P_i$ | $C_i$ | $L_i$ |
| Druck PTX50 4-20 mA Pressure | 7 to 28 V | 28 V | 180 mA | 0.7 W | 63.8 nF | 0 H |
| Druck PMP 0-5 Volt | 7 to 16 V | 16 V | 299 mA | 1.0 W | 367.4 nF | 0 H |
| APG MNU-IS-6424-C6A | 12 to 24 V | 28 VDC | 299 mA | 1200 mW | 0.365 uF | 0.228 uH |
| HF014PEN Flow Computer | 8.2, 12, or 24 V | 30 V | 150 mA | 0.92 W | 0 uF | |
| APG PT-400 4-20 mA | 9 V to 28 V | 28 VDC | 110 mA | 0.77 W | 55 nF | 7.95 uH |
| APG PT-400 Voltage - Div 2 | 12.5 V to 28 V (for 10 V sensor) | 28 VDC | 110 mA | 0.77 W | 0 uF | 0 uH |
| Core CS8X 4-20 mA | 10 to 28 V | 28 V | 93 mA | 650 mW | 0.27 uF | 0 uH |
| Core CS8X Voltage Output | 10 to 28 V | 28 V | 93 mA | 650 mW | 0.649 uF | 0 uH |
| Omega 4-20 mA Pressure | 10 to 28 V | 28 V | 110 mA | 0.77 mW | 48 nF | 0 uH |
| GEMS Series 3 XIS Pressure 4-20 mA | 8 to 30 V | 30 V | 100 mA | 0.7 W | 353 nF | 209 uH |
| EE300Ex-M1 Humidity & Temp 4-20 mA out | 10 to 28 V | 28 V | 100 mA | 700 mW | 2.2 nF | neg |

FIG. 7 provides a schematic view of a multi-board version of a pluggable/unpluggable ISB device or coupler 700 as an alternative version of the combined circuit 600 of FIG. 6. The assembled coupler 700 includes an 8-pin octal plug base 716. In this alternative version of the ISB, 2 oz. copper tracings (approximately 2.8 mils or 70 μm thick) in combination with the potting material are used on the resistor board 710, in place of a heat sink component (such as heat sink 1602 in FIG. 16) to dissipate the heat associated with resistor R1 106. Although the ISB 700 shown here is configured with an alternative version of ISB circuit 600, the hollow body 702 and plug base 716 are for use with any of the ISB configurations (400, 500A, 500B, 500c, and 600) of FIGS. 4, 5A, 5B, 5C, and 6. The Intrinsically Safe Barrier (ISB) 700 is shown having a hollow body 702 and in this instance the body 702 is generally cylindrical or tubular. The exemplary ISB 700 provides a pre-formed product that incorporates the electrical isolation and physical protection required for a field mounted intrinsically safe device/sensor or a simple device. A simple device is a device that requires no voltage to operate, such as a "Dry Contact," "Strain Gauge," or "Resistive Temperature device" commonly called an RTD. The Zener diodes 102 described above in the electrical circuitry of FIGS. 4-6 ensure that the maximum voltage of the circuit output from the ISB 700 will not exceed the clamping voltage of the diodes, which is greater than the voltage levels of the signal.

In this exemplary embodiment, the clamping voltage of the diodes ZD1 102 is determined by or is a function of the voltage requirements of the field intrinsically safe sensor/device 200. A typical signal is under 24 volts, so the Zener diodes 102 will permit the signal to pass through. If an application requires higher voltage signals to be allowed to pass through, diodes with a correspondingly higher clamping voltage would be selected. A current limiting resistor R1 106, rated at 300 ohms and 45 watts, controls the current through the circuit, limiting the current to the output of the circuit and to the diodes. A quick blow fuse F1 104 is provided in case of an excess of current. The electrical circuitry is disposed on one or more circuit board assembly (ies) installed inside the ISB housing, e.g., housing 702 as a one-piece hollow fitting, and then is encapsulated in a potting material. The potting material seals the electronics from the atmosphere, makes the entire ISB unit tamperproof, and has heat conducting characteristics permitting heat generated through the voltage drop to be safely dissipated.

ISB body 702 terminates at a bottom portion or end 704 and an opposite top end or top portion 706. Once components of the ISB, e.g., resistor circuit board 710, fuse/diode circuit board 712 and/or capacitor circuit board 714, are disposed inside the body 702 and with plug or terminal portion 716 connected to the components (wired and soldered) and fixed to the body 702, the body is filled with a potting material. The potting material fills the void 708 in the housing 702 from the inward facing surface of plug 716 to the top end 706. The circuit boards 710, 712, and 714 may be considered non-hazardous areas within the ISB and overall circuit. The plug 716 and circuit board components are positioned to effectively encapsulate the circuit boards and the discrete components and elements mounted thereto with the potting material. In this manner the potting material and the housing or body 702 dissipate heat associated with the components contained within the housing 702. The potting material also serves to secure the components within the housing 702 and to protect them from damage in handling, installation or operation.

Current limiting resistor R1 106 is a thick film resistor having a power rating of 45 watts, e.g., TKH series available from Ohmite Manufacturing Company. The resistor board 710, on to which resistor(s) R1 106 is mounted, is made of a special high heat resistant FR-406 material with 2 oz. copper tracing (approximately 2.8 mils or 70 μm thick). Special FR406 high performance epoxy laminate and prepreg product is available, for example, from Isola Group. The 2 oz. copper is selected for use on the resistor board 710 to provide additional on-board heat sink properties. In this manner, the resistor board 710 has a large heat sink of 2 oz. copper that is, for example, 1.5-plus square-inch area that will dissipate the heat from the voltage drop across the current limiting resistor R1 106. A single side of resistor board 710 is used in the configuration of FIG. 4 and two sides, Side A and Side B, of the resistor board 710 are used as in the three/four-wire and dual channel configurations of FIGS. 5A-5C.

The fuse/diode circuit board 712, on to which diodes 102 and fuse 104 are mounted, comprises a standard flame-resistant FR-4 laminate material (well-known in the art as a type of laminated glass epoxy sheet made from woven fiberglass), e.g., FR4-UL-94-V0, with a standard internal layer 1 oz. copper tracing (approximately 1.4 mils or 35 μm thick). A single side of fuse/diode board 712 is used in the configuration of FIG. 4 and two sides, Side A and Side B, of fuse/diode board 712 are used in connection with the three/four-wire and dual channel configurations of FIGS. 5A-5C. Capacitor board 714 is used in connection with the RS485 example circuit 602 of FIG. 6.

The housing 702 is a polymeric material housing made of, for example, a flame retardant, thermally conductive epoxy resin such as Underwriter's Laboratory UL-94-V0 tested/rated. One epoxy resin product available is part number 50-3150 FR available from Epoxies, Etc. and has a relative temperature index (RTI) rating of 130 degrees Celsius. Alternatively, the housing may be made of stainless steel, aluminum, Bakelite or other non-melting thermosetting resin or other suitable material. The potting material or encapsulating compound used to fill the void within housing 702 is a heat or thermally conducting casting/potting epoxy or polyurethane that is electrically insulative or non-conductive.

The plug 716 includes an 8-pin octal tube base and is adapted to be received within the bottom portion 704 of the housing 702. ISB housing end 704 may be machine finished or otherwise configured to receive and seal the multi-pin base of plug 716. With the plug received in part in the housing 702, a set of 8 pins 718 and a guide member 720 with a guide key 722 located between pins 1 and 8 project outwardly away from the housing 702 at the bottom 704. On the inward facing surface of the plug 716, a set of eight ports or receptacles correspond to the pins (1-8) 718 and are configured for wired connection to vias, traces, or other connection points associated with a set of PCBs, e.g., 710-714, included in the housing 702. The set of pins (1-8) 718 correspond to the pins as indicated in the exemplary ISB circuits of FIGS. 4-6. As the potting material is placed in the housing 702 it will naturally fill to the bottom portion 704 of the housing and contact the inward facing surface and contacts associated with the plug base. Although an 8-pin octal tube base 716 and mating sockets 816 and 916 are described herein, the invention is not limited to 8-pin configurations and these embodiments are included as examples solely for purpose of describing the invention.

Figure 8:
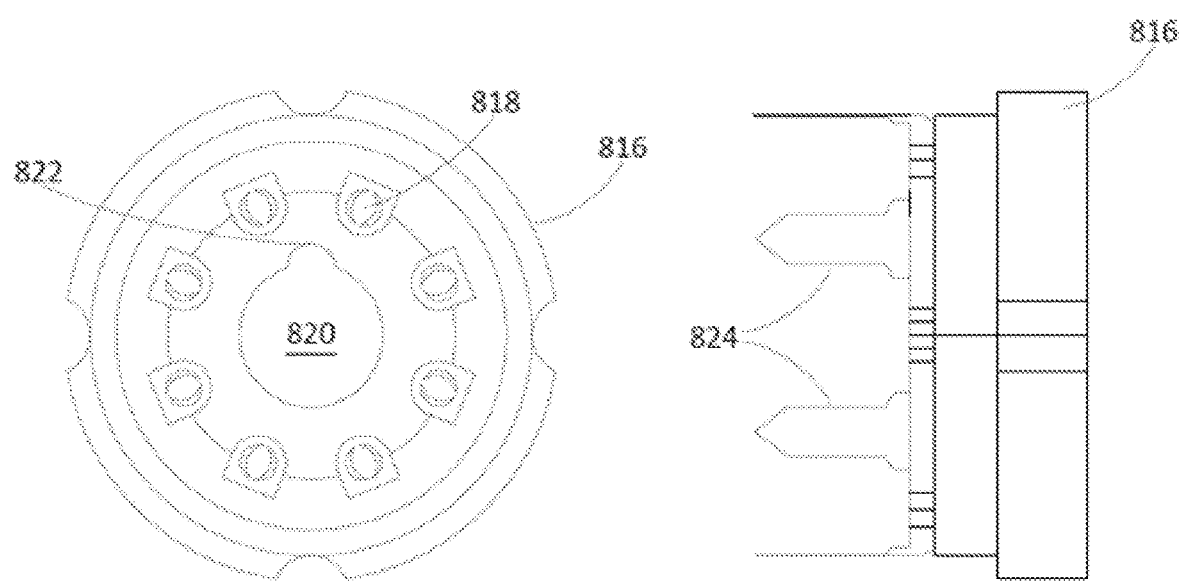
FIG. 8 provides a top-down view and a side view illustrating an exemplary 8-Pin Octal socket for use with the ISB coupler of FIG. 7.
Figure 9:
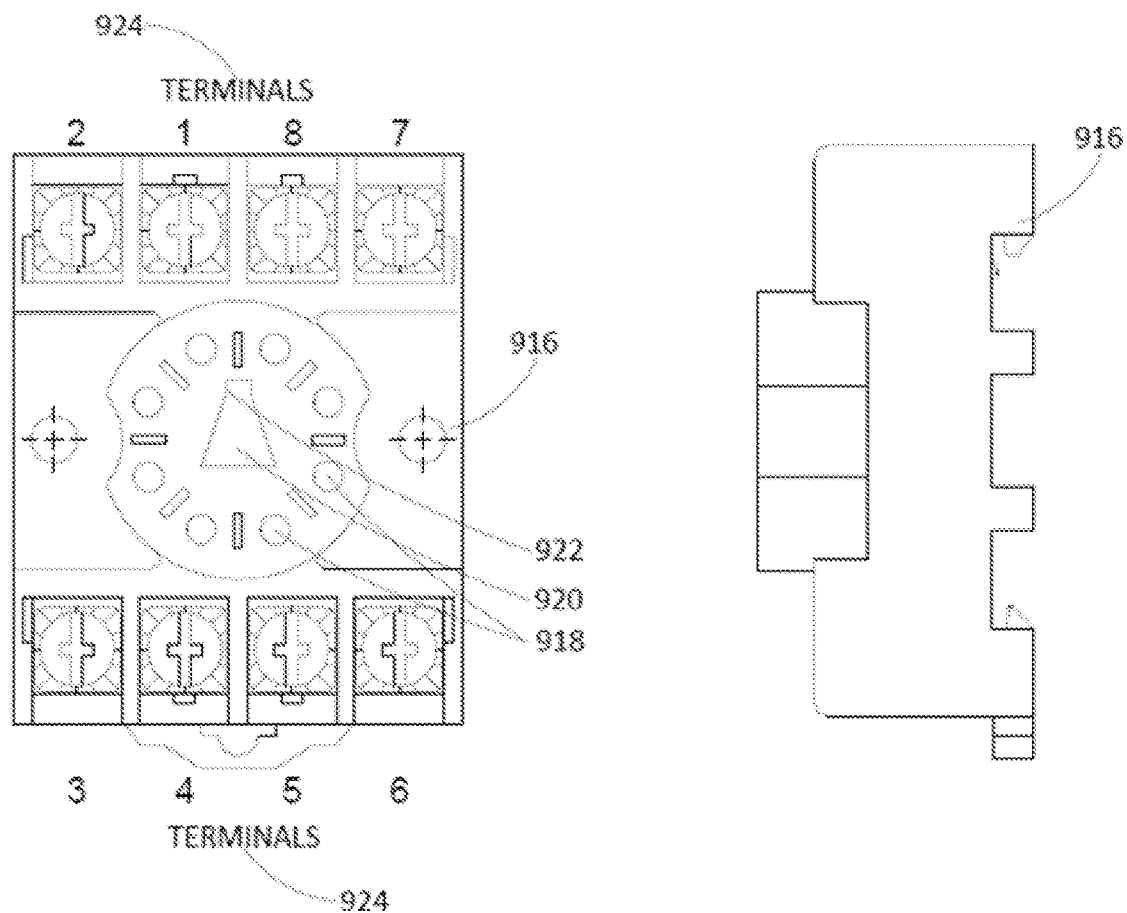
FIG. 9 provides a top-down view and a side view illustrating an alternative octal socket for use with the ISB coupler of FIG. 7.

FIGS. 8-9 provide perspective views of exemplary sockets 816/916 configured for use with the pluggable ISB 700 of FIG. 7. FIG. 8 illustrates a socket 816 having a set of leads or prongs for direct attachment, e.g., to a PCB. This allows the pluggable/unpluggable ISB 700 to be easily connected to and removed from a device having the PCB or other direct connection of socket 816. In this manner the socket 816 provides a circuit board mounting base. FIG. 9 illustrates an alternative, surface-mounted receptacle or socket 916 having a set of terminals, in this case eight screw terminals, for remote mounting and field termination of field devices into the mountable socket 916. This exemplary arrangement allows the pluggable/unpluggable ISB 700 to be easily connected to and removed from a field device or other device having the surface-mounted socket 916. Features included on the socket 916 may include panel/surface mount screw openings or recesses, DIN rail mountable, and pressure clamp screws. Although the plug 716 and socket 816/916 are disclosed in 8-pin arrangement, this is only for purposes of explaining the invention and is not limiting to other arrangements in accordance with the present invention.

FIG. 8 provides a top-down view and a side view illustrating an exemplary 8-Pin Octal socket for use with the ISB coupler of FIG. 7. Now with reference to FIG. 8 an exemplary 8-Pin Octal socket 816 couples with the ISB coupler 700 of FIG. 7. The exemplary octal socket 816 is, for example, available from Amplified Parts—Ceramic PC Mount having part number P-ST8-193X. The octal socket 816 is configured to receive in a male-female manner the male plug 716 of ISB 700 with key protrusion 722 of plug guide member 720 aligning and received in key receiving slot or recess 822 and guide member receiving opening or bore or journal 820. In this manner the pins (1-8) 718 of plug 716 match up with the socket receiving ports or receptacles (1-8) 818 and prongs (1-8) 824 of socket 816. The socket 816 includes a set of eight prongs 824 adapted for attaching, e.g., soldering, directly to a printed circuit board (PCB). Each prong corresponds to a pin 818 on the pluggable facing side of the socket 816. In this manner, with the socket 816 electrically connected to traces or other elements on a PCB, the socket 816 is supported by the PCB and may matingly receive male plug 716 of ISB 700.

FIG. 9 provides a top-down view and a side view illustrating an alternative surface-mount receptacle or socket 916 for use with the ISB coupler 700 of FIG. 7. The exemplary 8-Pin Octal socket 916 is, for example, available from NTE Electronics, Inc. having part number R95-113 having an electrical rating of 600 volts, 10 Amps. The octal socket 916 is configured to receive in a male-female manner the male plug 716 of ISB 700 with key protrusion 722 of plug guide member 720 aligning and received in slot 922 and guide journal 920. In this manner the pins (1-8) 718 of plug 716 match up with the socket receiving ports or receptacles (1-8) 918 and terminals (1-8) 924 of socket 916.

Figure 12:
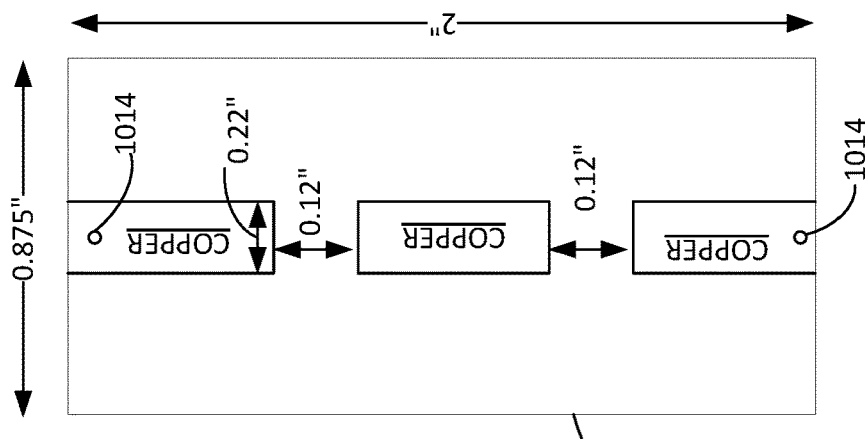
FIGS. 10-12 illustrate a first exemplary set of PCB layouts for the circuit boards 710, 712, and 714 for use with the ISB coupler of FIG. 7.
Figure 11:
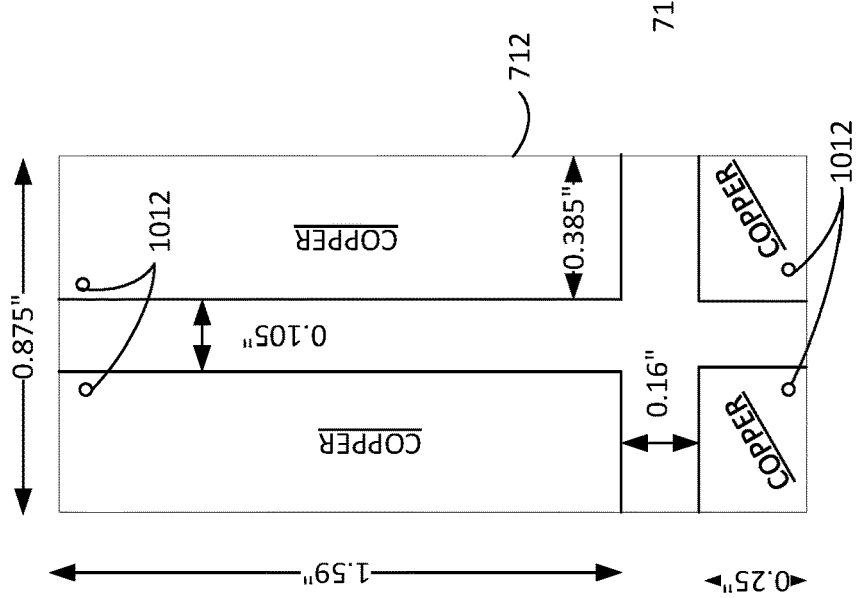
Figure 10:
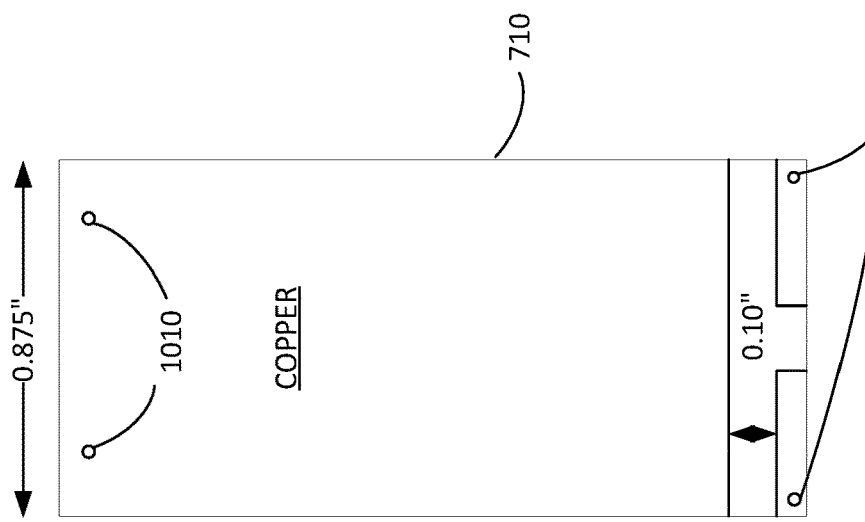

FIGS. 10-12 illustrate a first exemplary set of PCB layouts for the circuit boards 710, 712, and 714 for use with the ISB coupler of FIG. 7. Now with reference to FIG. 10, resistor board 710 is made of a special high heat resistant FR-406 material with 2 oz. copper tracing (approximately 2.8 mils or 70 μm thick). Special FR406-UL-94-V0 high performance epoxy laminate and prepreg product is used and is available, for example, from Isola Group. The 2 oz. copper is selected for use on the resistor board 710 to provide additional on-board heat sinking properties. In this manner, the resistor board 710 has a large heat sink of 2 oz. copper that is, for example, 1.5-plus square-inch area that will dissipate the heat from the voltage drop across the high wattage, current limiting resistor(s) R1 106. The dimension of the board 710 is approximately two inches×0.875 inch and includes connective vias 1010 plated through the copper and laminate board and being about 0.070 inch in diameter. As shown, the board 710 includes the 2 oz. copper essentially throughout the area of the board. Not shown on this illustration, the copper is covered by the FR406-UL-94-V0 epoxy laminate. A single side of resistor board 710 with single resistor R1 106 is used in the configuration of FIG. 4. Two sides, Side A and Side B, of the resistor board 710 with two resistors R1 106 are used in the three/four-wire and dual channel configurations of FIGS. 5A-5C.

FIG. 11 provides an illustration of fuse/diode board 712 without fuse F1 104 and diodes ZD1 102 attached. Unlike the high-performance epoxy and 2 oz copper provided in the resistor board 710, the fuse/diode circuit board 712 includes a standard FR-4 material (well-known in the art as a type of laminated glass epoxy sheet made from woven fiberglass), e.g., FR4-UL-94-V0, with a standard internal layer 1 oz. copper tracing (approximately 1.4 mils or 35 μm thick). A single side of fuse/diode board 712, along with a single fuse F1 104 and one set of three diodes ZD1 102, is used in the configuration of FIG. 4. Two sides, Side A and Side B, of fuse/diode board 712, along with two fuses F1 104 and two sets of three diodes ZD1 102, are used in connection with the three/four-wire and dual channel configurations of FIGS. 5A-5C. The dimension of the board 712 is approximately two inches×0.875 inch and includes connective vias 1012 plated through the copper and laminate board and being about 0.070 inch in diameter. Location of copper is shown in the figure along with additional measurements pertaining to the PCB layout and design.

FIG. 12 provides an illustration of the capacitor board 714 without capacitors C1 110 attached. Unlike the high-performance epoxy and 2 oz copper provided in the resistor board 710, the capacitor board 714 includes a standard FR-4 material (well-known in the art as a type of laminated glass epoxy sheet made from woven fiberglass), e.g., FR4-UL-94-V0, with a standard internal layer 1 oz. copper tracing (approximately 1.4 mils or 35 μm thick). A single side of capacitor board 714, along with a single pair of capacitors C1 110, is used in the RS485 circuit 602 of FIG. 6. In the alternative configuration of FIG. 18, there would be one board with two sides having two capacitors on each side, this protects the 2-way communication when capacitors are used the fault is a "Shor" so the standard requires two capacitors in series. The dimension of the board 712 is approximately two inches×0.875 inch and includes connective vias 1012 plated through the copper and laminate board and being about 0.070 inch in diameter. Location of copper is shown in the figure along with additional measurements pertaining to the PCB layout and design.

The housing 702 of ISB 700 is configured to provide an internal cavity sufficient to permit placement of three boards, e.g., the embodiment of FIG. 6 requires all three circuit boards 710, 712 and 714, therein with sufficient additional volume to receive an amount of epoxy resin to provide adequate heat dissipation given the operational characteristics including operating temperature of the components included on the circuit boards.

FIGS. 13-14 illustrate a second exemplary set of unpopulated PCB layouts associated with schematic "A" and "B" embodiments of the present invention including a resistor board configured for use with a heat sink (1602 of FIG. 16). FIG. 15 illustrates an exemplary unpopulated PCB capacitor board layout associated with a RS485 schematic "C" embodiment of the present invention.

In this illustration, a resistor board 1310 with side A and side B includes two-ounce copper and is rated at FR-406, UL94-V0 high temperature. Fuse/Diode board 1312 with side A and side B includes one-ounce copper and is rated at FR-4, UL94-V0. RS-485 board 1314 with side A and side B includes one-ounce copper and is rated at FR-4, UL94-V0. In this exemplary embodiment, the dimensions of boards 1310-1314 are essentially the same at 0.875" W×1.0" H×0.062" thick with vias at 0.0625".

FIGS. 16-17 illustrate an exemplary set of component-populated PCB layouts (resistor board (FIG. 16) and fuse/diode board (FIG. 17)) associated with schematic "A" (side A populated only) and schematic "B" (sides A and B populated) embodiments of the present invention including a resistor board 1310 having a heat sink 1602 on one or both sides. FIG. 18 illustrates an exemplary capacitor-populated PCB capacitor board layout 1314 associated with a RS485 schematic "C" embodiment of the present invention. FIGS. 16-18 illustrate the PCB boards 1310-1314 of FIGS. 13-15 with an exemplary set of populated components wherein RA/RB are, for example, 300 ohms rated at 45 watts as manufactured by Ohmite having model number TKH45P300RFE-TR. As shown, heat sink 1602 for use on the boards is, for example, Model SKU FIT0556 manufactured by DF Robot. Zener diodes ZD provide a clamping voltage and are rated for controlling 24 VDC with operating power of 5 watts and peak pulse power dissipation (PPD) at 600 watts, e.g., part SMBJ24A available from Littelfuse, Inc. The capacitors C provide 2.2 μF and with an oscillating signal at 2 MHz the capacitive reactance experienced on the signal is 0.072 ohms and with a signal at 64 MHz the capacitive reaction experienced on the signal is 0.002 ohms. Resistance at VDC (frequency=0) is effectively infinity ohms, i.e., open circuit. Capacitor C1 110, for example, may be obtained from Murata Electronics, XR7 Series, model number KCM55TR72A106MH01K.

Figure 19A:
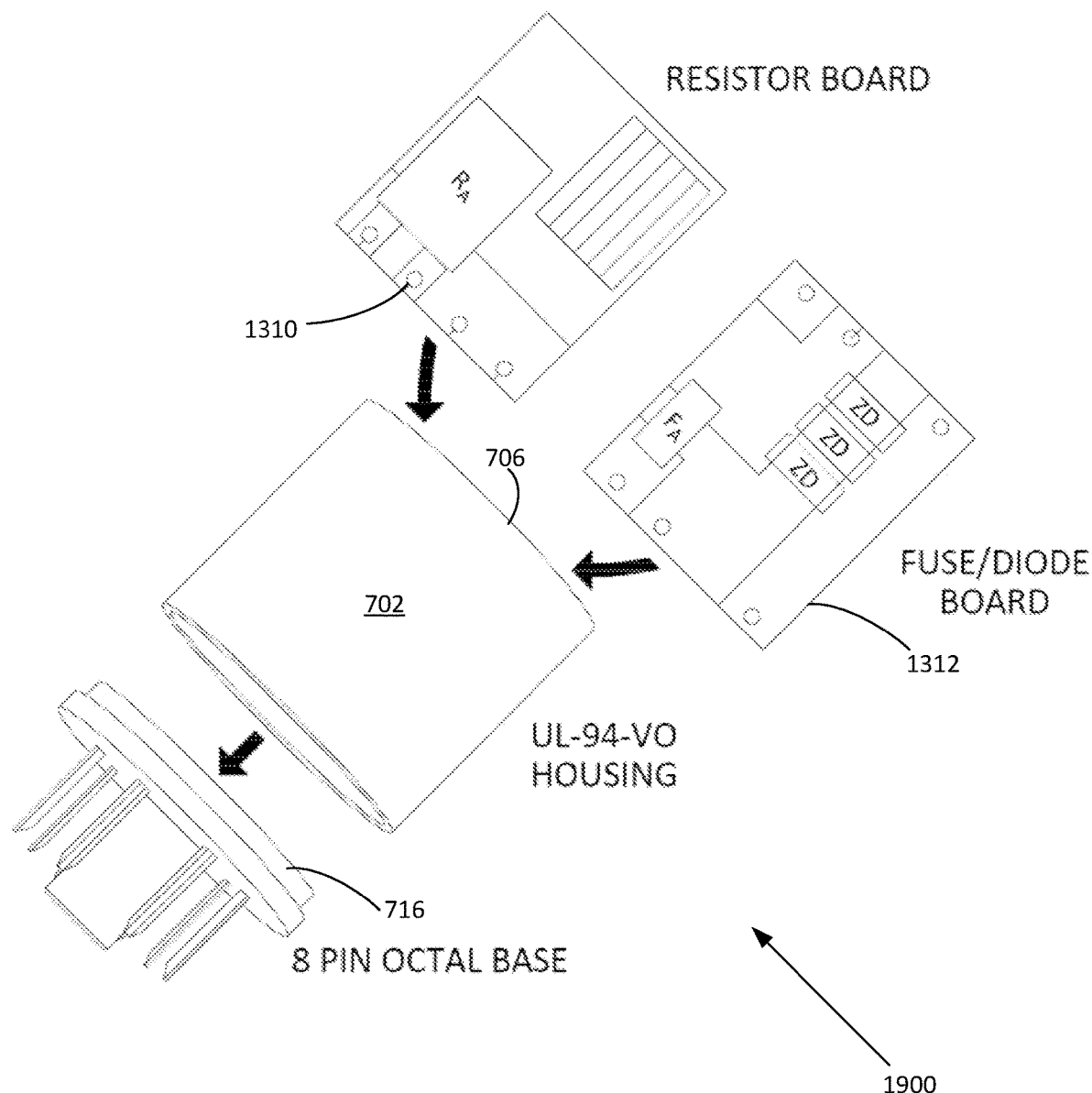
FIG. 19A provides an exploded view of an ISB device exemplary of the schematic "A" and schematic "B" circuit types (side A side shown) configured on the circuit boards shown in FIGS. 13-14 and 16-17 with associated housing and plug components.

FIG. 19A provides an exploded view of an ISB device 1900 exemplary of the schematic "A" and schematic "B" circuit types (side A side shown) configured on the resistor board 1310 and fuse/diode board 1312 shown in FIGS. 13-14 and 16-17 with associated housing 702 and plug 716 components. Note for schematic "A" only side A components are included and for schematic "B" both side A and side B components are included.

Figure 19B:
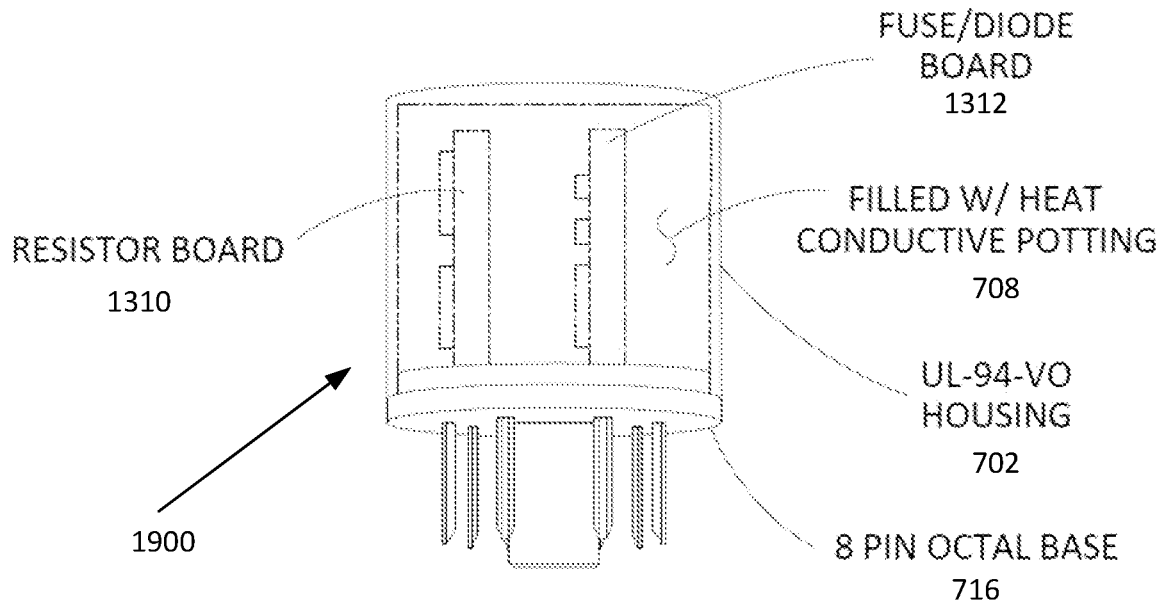
FIG. 19B illustrates in partial cross-section view an exemplary assembled ISB device incorporating the schematic "A" circuit type configured on the resistor and fuse/diode boards (sides A only) shown in FIGS. 13-14 and 16-17 along with associated housing and plug components.

FIG. 19B illustrates in partial cross-section view an exemplary assembled ISB device 1900 incorporating the schematic "A" circuit type configured on the resistor board 1310 and fuse/diode board 1312 (sides A only) shown in FIGS. 13-14 and 16-17 along with associated housing 702 and plug 716 components.

In one manner of use of the ISB 1900 of FIGS. 19A/19B, the ISB may be used in connection with a RS-485 high frequency bypass filter included on, for example, an associated motherboard to which the ISB is mounted. By separating the HF bypass filter, the 8-pin octal base/socket configuration can accommodate the pin connections associated with resistor board 1310 and fuse/diode board 1312. This requires two separate ISBs, one for the RS485 circuit and one for either the two-wire configuration of FIG. 4 or the three/four-wire and dual channel configurations of FIGS. 5A-5C.

Figure 20:
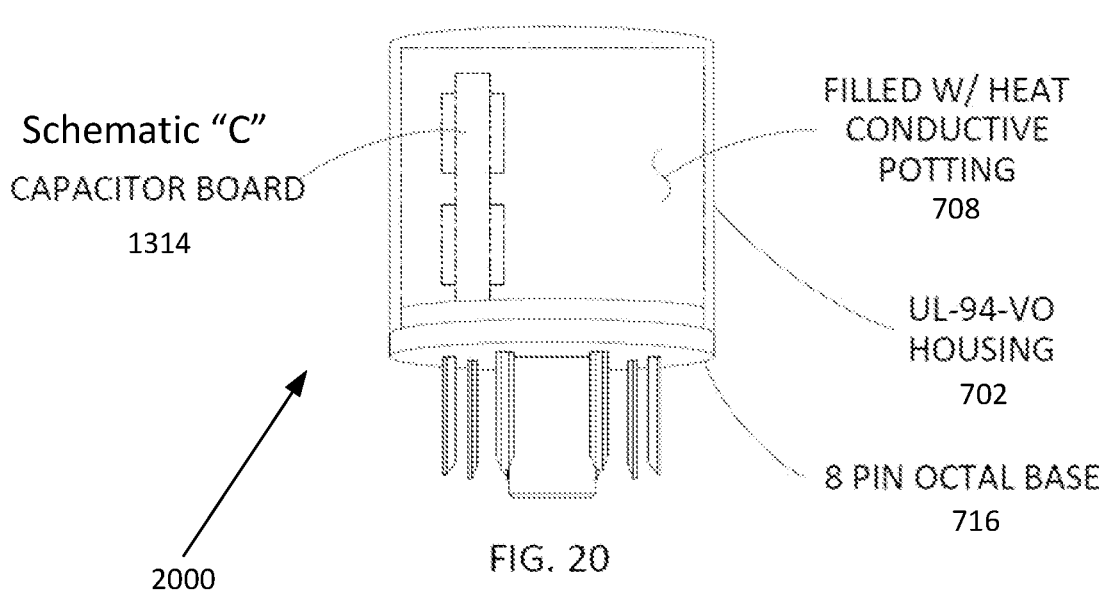
FIG. 20 illustrates in partial cross-section view an assembled ISB device incorporating the RS485 schematic "C" circuit configured on the capacitor board configuration shown in FIGS. 15 and 18 along with associated housing and plug components.

FIG. 20 illustrates in partial cross-section view an assembled ISB device 2000 incorporating the RS485 schematic "C" circuit configured on the capacitor board 1314 configuration shown in FIGS. 15 and 18 along with associated housing 702 and plug 716 components. FIG. 20 illustrates an alternative ISB 2000 RS-485 high frequency bypass filter for use in combination with the ISB 1900 of FIGS. 19A/19B. ISB 2000 includes the RS-485 capacitor board 1314 having capacitors 110 as shown, e.g., in FIG. 6. In this configuration two ISBs (ISB 1900 and ISB 2000) work together and are mounted on a motherboard or other receiving device.

FIG. 21 illustrates a fourth alternative embodiment ISB schematic circuit "D" for use as an ISB in connection with a single-channel, 3-wire voltage operated device application. A key difference in the ISB schematic "D" 2100 and the ISB schematic "B" (500A-500C) of FIGS. 5A-5C, is in place of the second high wattage resistor $R_1B$, a Diode D2, rated at 50 VDC, operating current of 2 amps with PPD at 600 Watts is provided. D2 may be sourced from, for example, ON Semiconductor part number ES2A.

FIG. 22 illustrates board layouts 1310-D and 1312 associated with the schematic circuit "D" 2100 of FIG. 21 for assembly with ISB housing and plug components shown in FIGS. 7, 19A/B, and 20. Here diode/fuse board 1312 is as described above. Resistor board 1310-D has only one resistor $R_1A$ and one diode 2102 in place of the second resistor of three/four-wire and dual channel configurations of FIGS. 5A-5C.

While the invention has been described by reference to certain preferred embodiments, it should be understood that numerous changes could be made within the spirit and scope of the inventive concept described. Also, the present invention is not to be limited in scope by the specific embodiments described herein. It is fully contemplated that other various embodiments of and modifications to the present invention, in addition to those described herein, will become apparent to those of ordinary skill in the art from the foregoing description and accompanying drawings. Thus, such other embodiments and modifications are intended to fall within the scope of the following appended claims. Further, although the present invention has been described herein in the context of particular embodiments and implementations and applications and in particular environments, those of ordinary skill in the art will appreciate that its usefulness is not limited thereto and that the present invention can be beneficially applied in any number of ways and environments for any number of purposes. Accordingly, the claims set forth below should be construed in view of the full breadth and spirit of the present invention as disclosed herein.

The invention claimed is:

1. An Intrinsically Safe Barrier ("ISB") for allowing electrical transmission of an electrical signal between a safe area and a field device in a hazardous area, the ISB comprising:
an ISB housing having a hollow interior portion adapted to receive a set of one or more printed circuit boards collectively forming an ISB circuit, the housing being made of a fire-retardant material rated UL94V0;
a set of Zener diodes mounted on the set of one or more printed circuit boards and electrically connected between a supply voltage and an intrinsically safe ground, the set of Zener diodes configured to provide a clamping voltage to shunt to ground any signal greater than the clamping voltage and to permit a signal lower than the clamping voltage to pass to a field device located in a hazardous area;
a current limiting circuit board from the set of one or more printed circuit boards having a UL94V0 rated laminate layer, and having a high wattage power resistor disposed thereon to limit current to the field device and to the set of Zener diodes, and further comprising a heat sink arranged to dissipate heat associated with a voltage drop across the power resistor, and wherein the power resistor is configured to have a relatively low resistance value and low voltage drop in the ISB; and
a thermally conductive potting material disposed in the hollow interior portion of the housing and being in direct thermal contact with the current limiting circuit board and the ISB housing, whereby heat dissipated by the heat sink of the current limiting circuit board is further dissipated in the potting material and the ISB housing.

2. The ISB of claim 1, wherein the resistor is rated at or about 300 ohms and 45 Watts.

3. The ISB of claim 1, further comprising a plug comprising a set of pins at one end and at the other end a set of connectors for connecting with the ISB circuit, the plug configured to attach to an end of the ISB housing with the set of pins projecting outward from the ISB housing and the set of connectors facing inward toward the hollow interior portion, whereby with the potting material disposed in the interior of the housing the material encapsulates the set of connectors.

4. The ISB of claim 3, wherein the plug is configured to mate with a socket, the socket having a set of terminals configured to physically and electrically align with the set of pins of the plug, and wherein the plug is in a pluggable/unpluggable relation with the socket to avoid wire manipulation in making or unmaking a connection with the socket.

5. The ISB of claim 4, wherein the plug is an 8-pin octal plug and the socket is an 8-terminal octal socket and wherein the plug includes a guide member having a key guide and the socket includes a central receiving opening and recess into which the guide member and key guide are matingly aligned and received to insure proper alignment of the set of pins with the set of terminals.

6. The ISB of claim 1, wherein the ISB circuit further comprises at least one fuse connected to the supply voltage to provide for over-current protection.

7. The ISB of claim 1, wherein the housing is made of one from the group consisting of epoxy resin rated UL-94-V0, stainless steel, aluminum, and Bakelite.

8. The ISB of claim 1, wherein the set of one or more printed circuit boards is configured to either connect with a two-wire field device or to connect with a three-wire field device.

9. The ISB of claim 1, wherein the set of one or more printed circuit boards further comprises a set of capacitors configured to permit passing of a high frequency signal between the ISB and the field device.

10. The ISB of claim 1, wherein the current limiting circuit board further comprises a copper layer, wherein the copper layer is configured as a heat sink to dissipate heat associated with a voltage drop across the power resistor and includes 2 oz. copper over a majority of the board as a heat conductive sink for the power resistor.

11. A pluggable/unpluggable ISB system for allowing electrical transmission of an electrical signal between a safe area and a field device in a hazardous area, the ISB system comprising:
an ISB plug component comprising:
an ISB housing having a hollow interior portion adapted to receive a set of one or more printed circuit boards collectively forming an ISB circuit, the housing being made of a fire retardant material rated UL94V0;
a set of Zener diodes mounted on the set of one or more printed circuit boards and electrically connected between a supply voltage and an intrinsically safe ground, the set of Zener diodes configured to provide a clamping voltage to shunt to ground any signal greater than the clamping voltage and to permit a signal lower than the clamping voltage to pass to a field device located in a hazardous area;
a high wattage power resistor disposed on a portion of the set of one or more printed circuit boards having a UL94V0 rated laminate layer and a heat sink disposed thereon in thermal conduction with the resistor, the resistor configured to limit current to the field device and to the set of Zener diodes, wherein the heat sink dissipates heat associated with a voltage drop across the power resistor, and wherein the power resistor is configured to have a relatively low resistance value and low voltage drop in the ISB;
a thermally conductive potting material disposed in the hollow interior portion of the housing and being in direct thermal contact with the set of one or more printed circuit boards and the ISB housing, whereby heat dissipated by the copper layer of the set of one or more printed circuit boards is further dissipated in the potting material and the ISB housing; and
a plug comprising a set of pins at one end and at the other end a set of connectors for connecting with the ISB circuit, the plug configured to attach to an end of the ISB housing with the set of pins projecting outward from the ISB housing; and an ISB socket component comprising:
a set of terminals configured to physically and electrically align with the set of pins of the plug;
wherein the ISB plug is in a pluggable/unpluggable relation with the ISB socket to avoid wire manipulation in making or unmaking a connection with the ISB socket.

12. The ISB system of claim 11, wherein the ISB socket is configured to mount on to a circuit board to permit the ISB plug to direct connect with a circuit board.

13. The ISB system of claim 11, wherein the ISB socket component is configured to surface mount to a structure and includes a set of terminals to facilitate field termination of wires between the ISB socket and a field device.

14. The ISB system of claim 11, wherein the ISB plug component is an 8-pin octal plug having a guide member and a key guide and the ISB socket component is an 8-terminal octal socket having a central receiving opening and recess into which the guide member and key guide are matingly aligned and received to insure proper alignment of the set of pins with the set of terminals.

15. The ISB system of claim 11 further comprising a second ISB component and a second socket component, the second ISB component having a printed circuit board comprising a set of capacitors configured to permit passing of a high frequency signal between the ISB and a field device operatively connected via the second socket component.

* * * * *